(12) United States Patent
Asami et al.

(10) Patent No.: US 8,198,666 B2
(45) Date of Patent: Jun. 12, 2012

(54) SEMICONDUCTOR DEVICE INCLUDING A NONVOLATILE MEMORY ELEMENT HAVING FIRST, SECOND AND THIRD INSULATING FILMS

(75) Inventors: Yoshinobu Asami, Kanagawa (JP); Manabu Sato, Tochigi (JP)

(73) Assignee: Semiconductor Energy Laboratory Co., Ltd., Kanagawa-Ken (JP)

(*) Notice: Subject to any disclaimer, the term of this patent is extended or adjusted under 35 U.S.C. 154(b) by 129 days.

(21) Appl. No.: 12/699,938

(22) Filed: Feb. 4, 2010

(65) Prior Publication Data

US 2010/0213531 A1 Aug. 26, 2010

(30) Foreign Application Priority Data

Feb. 20, 2009 (JP) ................. 2009-037635

(51) Int. Cl.
H01L 29/788 (2006.01)
(52) U.S. Cl. ............... 257/314; 257/239; 257/E29.3; 257/E21.179; 711/103
(58) Field of Classification Search .......... 257/314, 257/E29.3, E21.179, 360
See application file for complete search history.

(56) References Cited

U.S. PATENT DOCUMENTS

| 4,453,234 A | 6/1984 | Uchida |
| 5,886,376 A | 3/1999 | Acovic et al. |
| 5,888,868 A | 3/1999 | Yamazaki et al. |
| 5,960,265 A | 9/1999 | Acovic et al. |
| 6,005,270 A | 12/1999 | Noguchi |
| 6,498,369 B1 | 12/2002 | Yamazaki et al. |
| 6,556,475 B2 | 4/2003 | Yamazaki et al. |
| 6,646,922 B2 | 11/2003 | Kato |
| 2002/0008273 A1 | 1/2002 | Kumazaki |
| 2003/0047747 A1 | 3/2003 | Kumazaki |
| 2003/0052363 A1 | 3/2003 | Kumazaki |
| 2004/0113197 A1 | 6/2004 | Yoshida et al. |
| 2005/0077580 A1 | 4/2005 | Kumazaki |
| 2005/0258473 A1 | 11/2005 | Yoshida et al. |
| 2005/0277253 A1 | 12/2005 | Kato et al. |
| 2006/0151827 A1 | 7/2006 | Kumazaki |
| 2007/0029605 A1 | 2/2007 | Kumazaki |

(Continued)

FOREIGN PATENT DOCUMENTS

EP 1 837 900 A2 9/2007

(Continued)

*Primary Examiner* — N Drew Richards
*Assistant Examiner* — Peter Bradford
(74) *Attorney, Agent, or Firm* — Nixon Peabody LLP; Jeffrey L. Costellia

(57) ABSTRACT

A nonvolatile memory element which is provided with a floating gate electrode and a high withstand voltage transistor which is provided with a thick gate insulating film are formed over one substrate without increase in a driving voltage of the nonvolatile memory element. A stacked film of a first insulating film and a second insulating film is formed between an island-like semiconductor region and a floating gate electrode of the nonvolatile memory element and between an island-like semiconductor region and a gate electrode of the transistor. The first insulating film overlapping with the floating gate electrode is removed, and the insulating film between the island-like semiconductor region and the floating gate electrode is formed thinner than the gate insulating film of the transistor. The transistor includes a conductive film which is formed in the same layer as the floating gate electrode and a conductive film which is formed in the same layer as a control gate electrode, and these two conductive films are electrically connected to each other and function as the gate electrodes of the transistor.

21 Claims, 18 Drawing Sheets

U.S. PATENT DOCUMENTS

| | | |
|---|---|---|
| 2007/0221971 A1 | 9/2007 | Yamazaki et al. |
| 2007/0228452 A1 | 10/2007 | Asami |
| 2007/0235794 A1 | 10/2007 | Yamazaki et al. |
| 2008/0003745 A1* | 1/2008 | Myung et al. ............... 438/257 |
| 2008/0049500 A1 | 2/2008 | Kato et al. |
| 2008/0203477 A1* | 8/2008 | Yamazaki et al. ........... 257/347 |
| 2009/0206390 A1* | 8/2009 | Morikado ................... 257/324 |
| 2009/0278188 A1 | 11/2009 | Asami |

FOREIGN PATENT DOCUMENTS

| | | |
|---|---|---|
| JP | 05-304300 | 11/1993 |
| JP | 07-130893 | 5/1995 |
| JP | 08-130258 | 5/1996 |
| JP | 2006-013534 | 1/2006 |
| JP | 2007-288176 | 11/2007 |

* cited by examiner

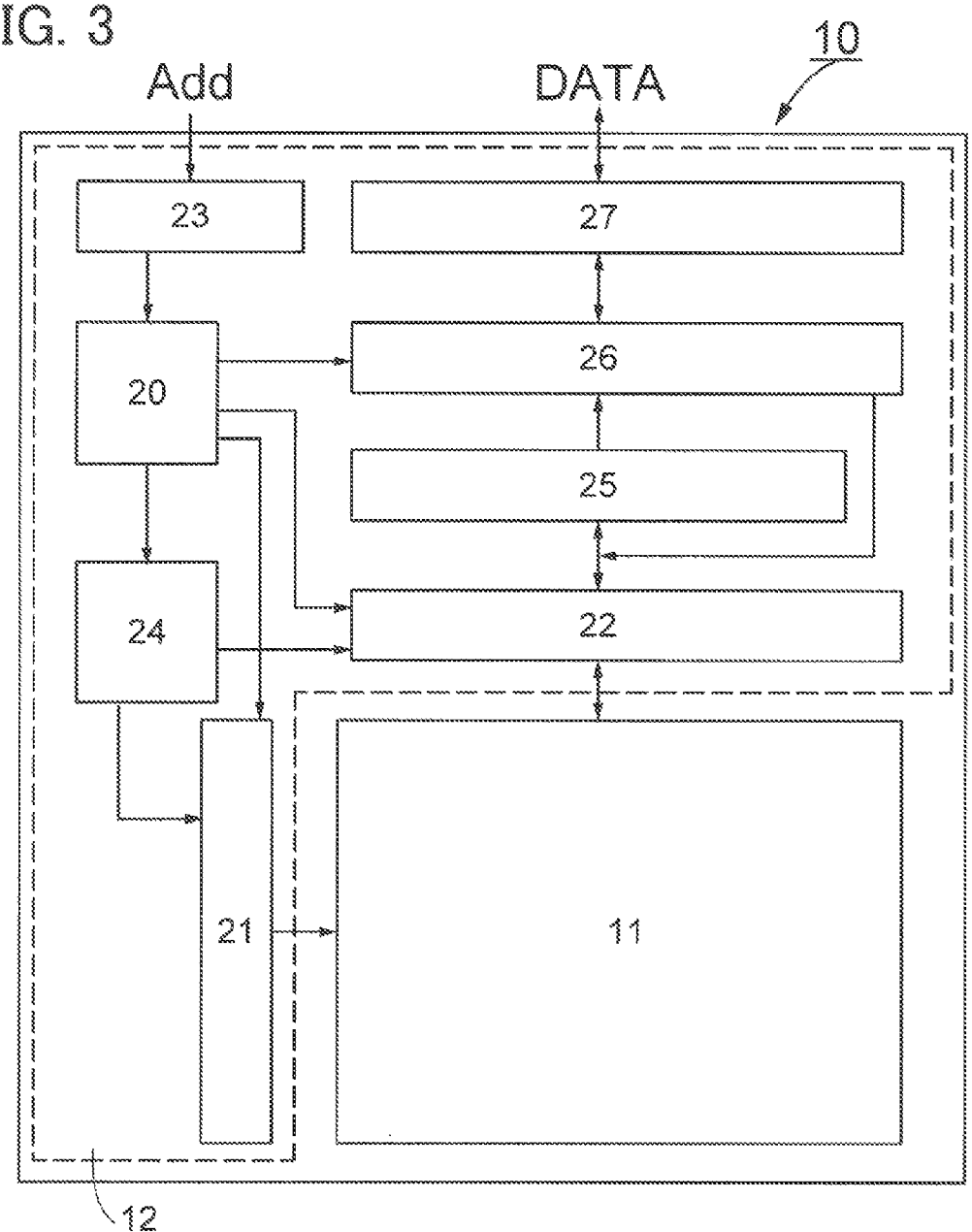

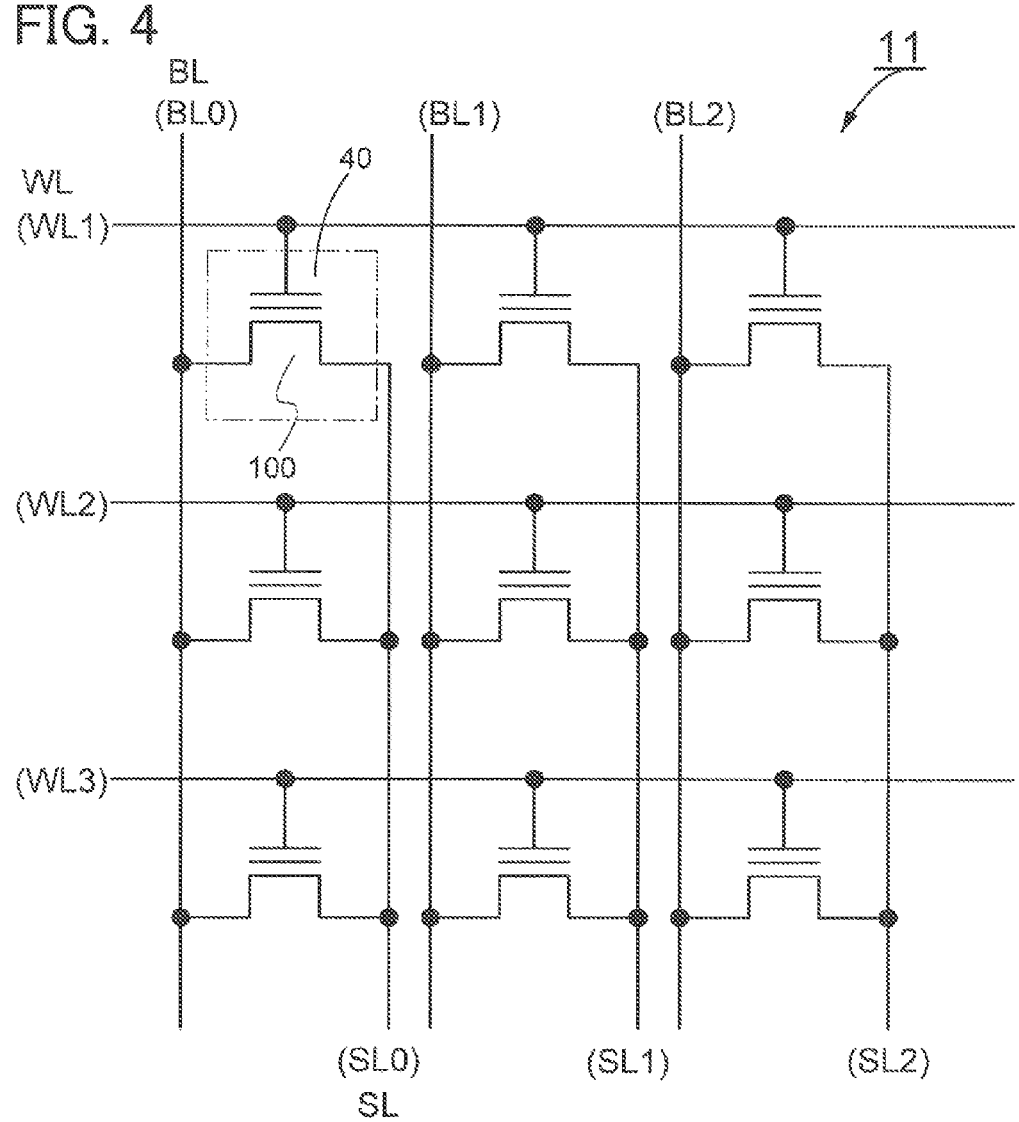

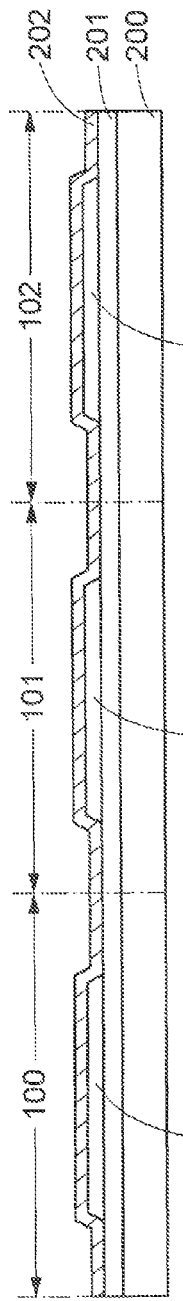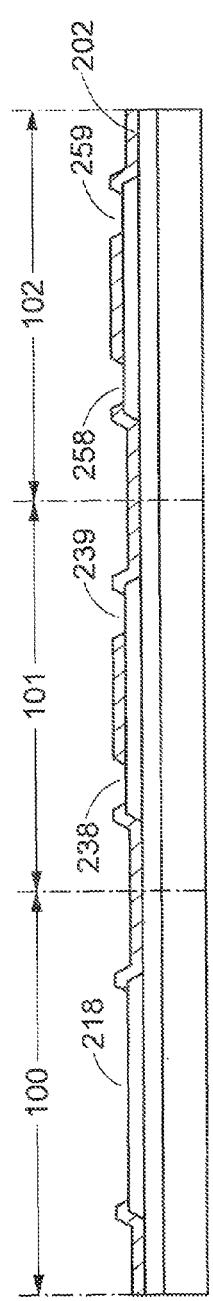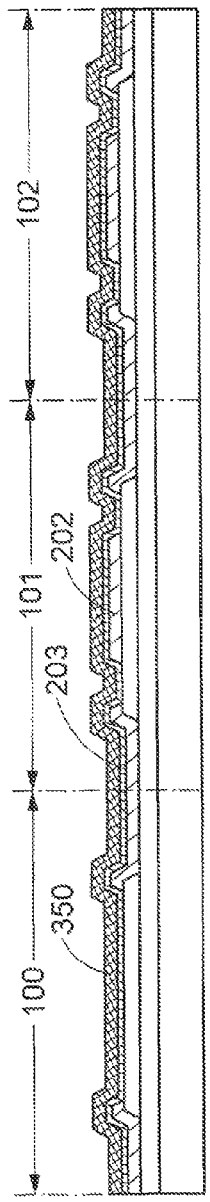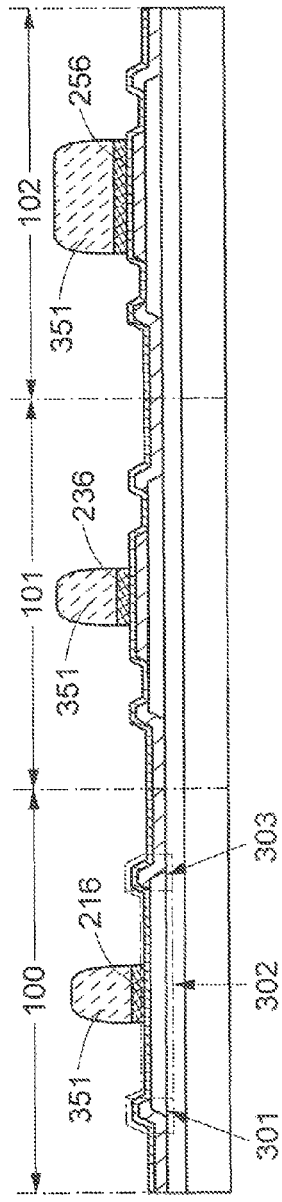
FIG. 5A
FIG. 5B
FIG. 5C
FIG. 5D

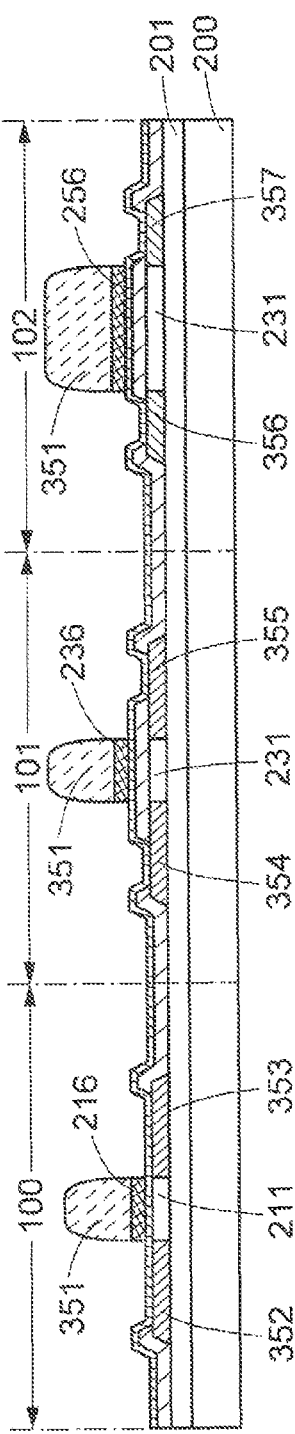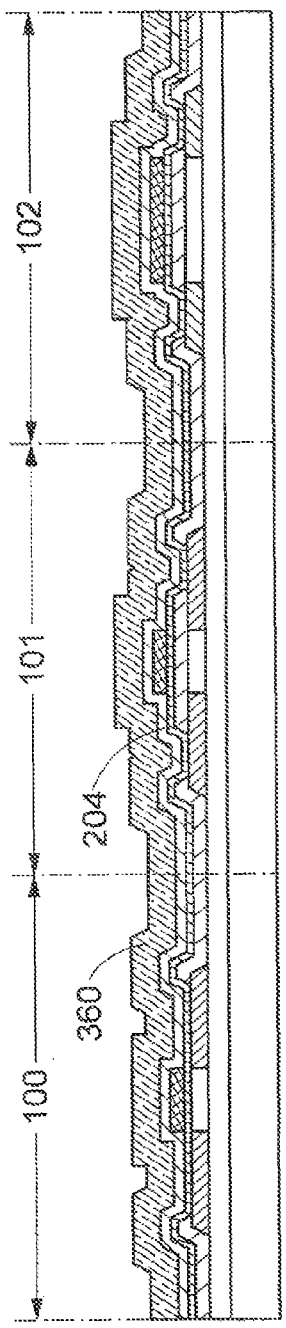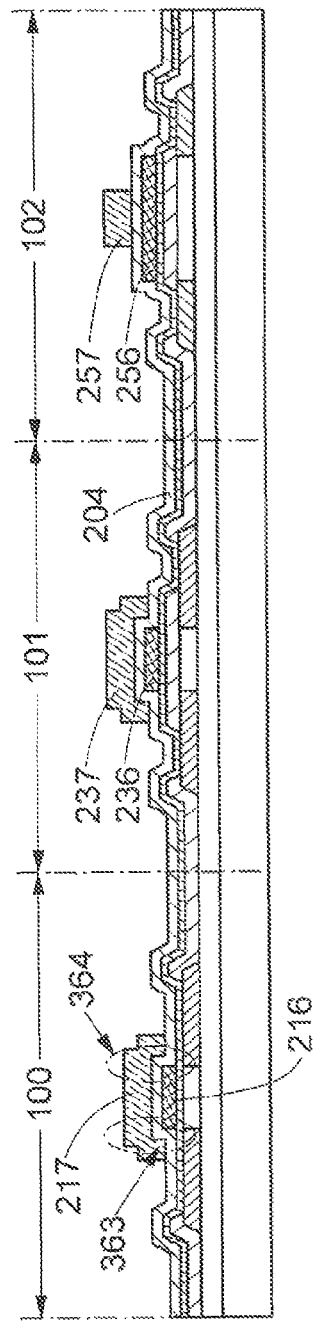
FIG. 6A
FIG. 6B
FIG. 6C

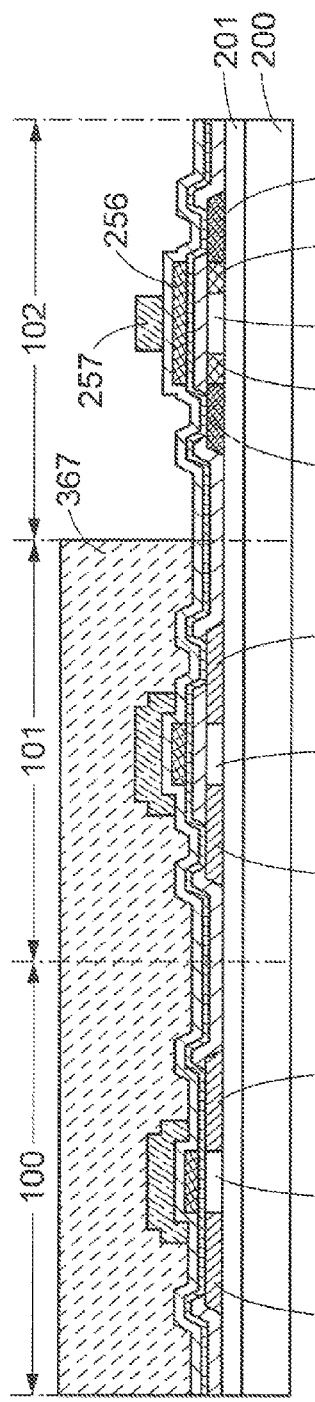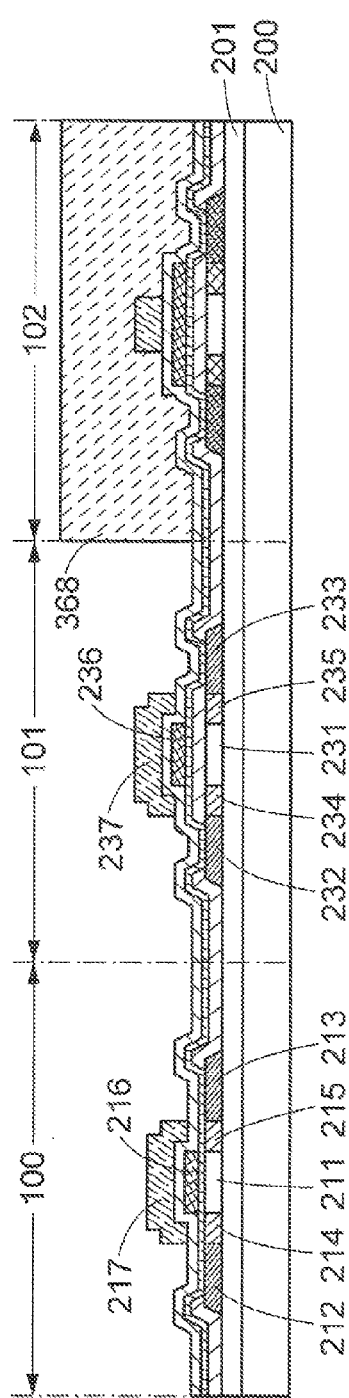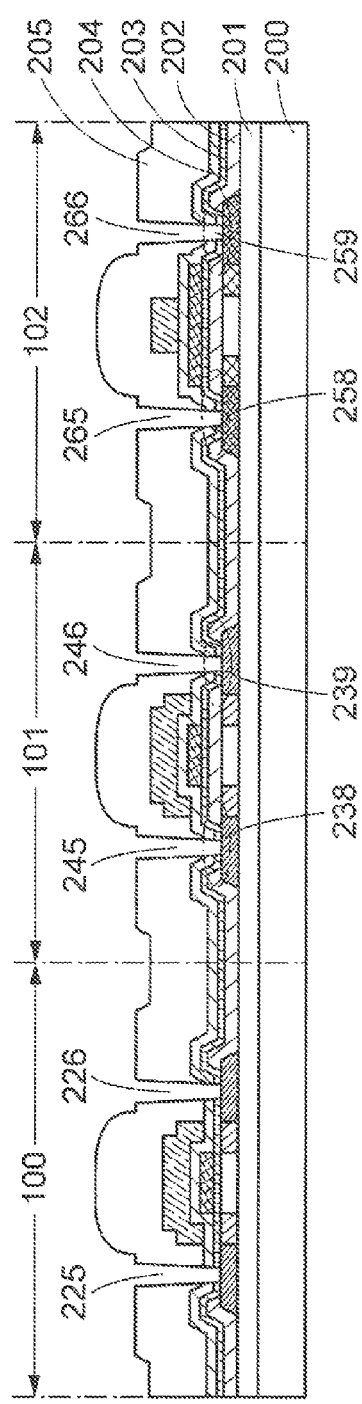

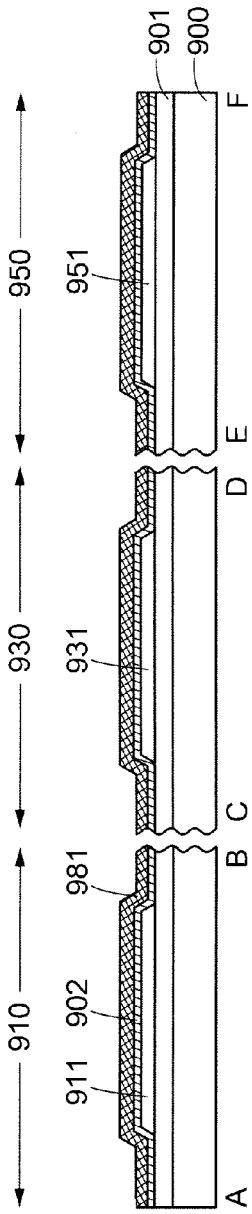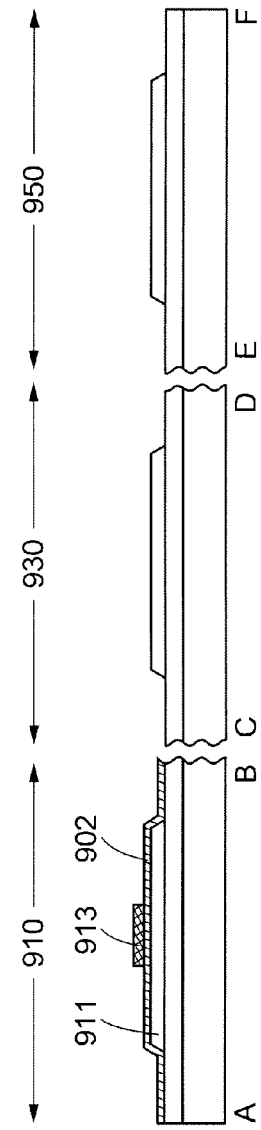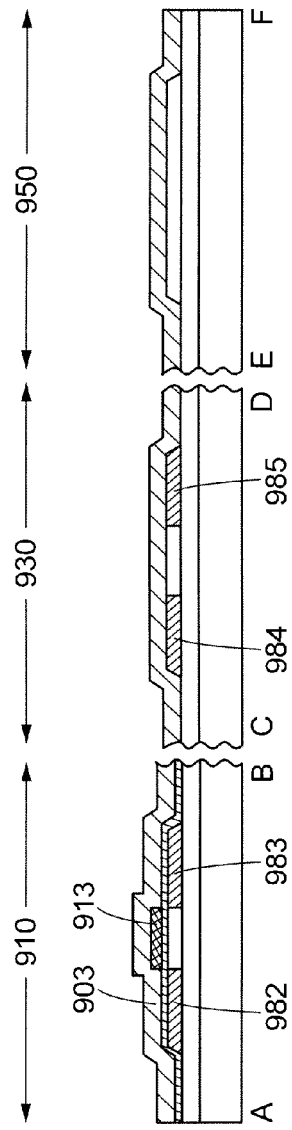
FIG. 15A PRIOR ART
FIG. 15B PRIOR ART
FIG. 15C PRIOR ART

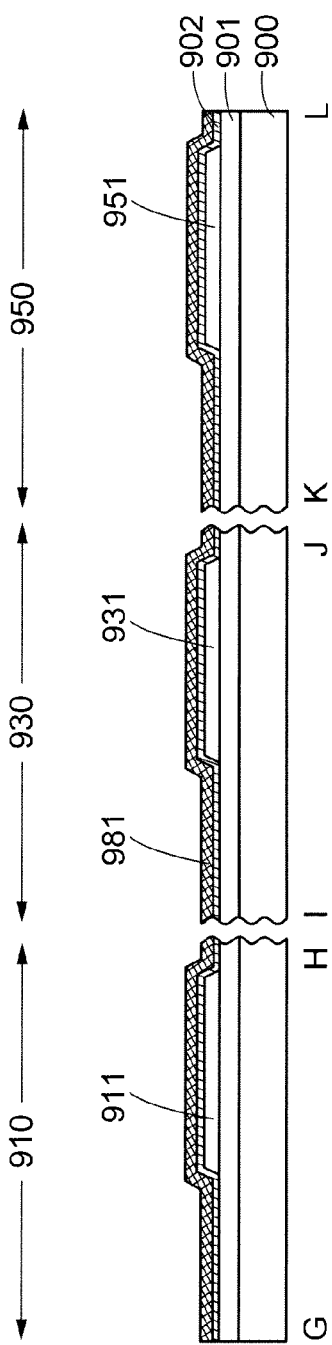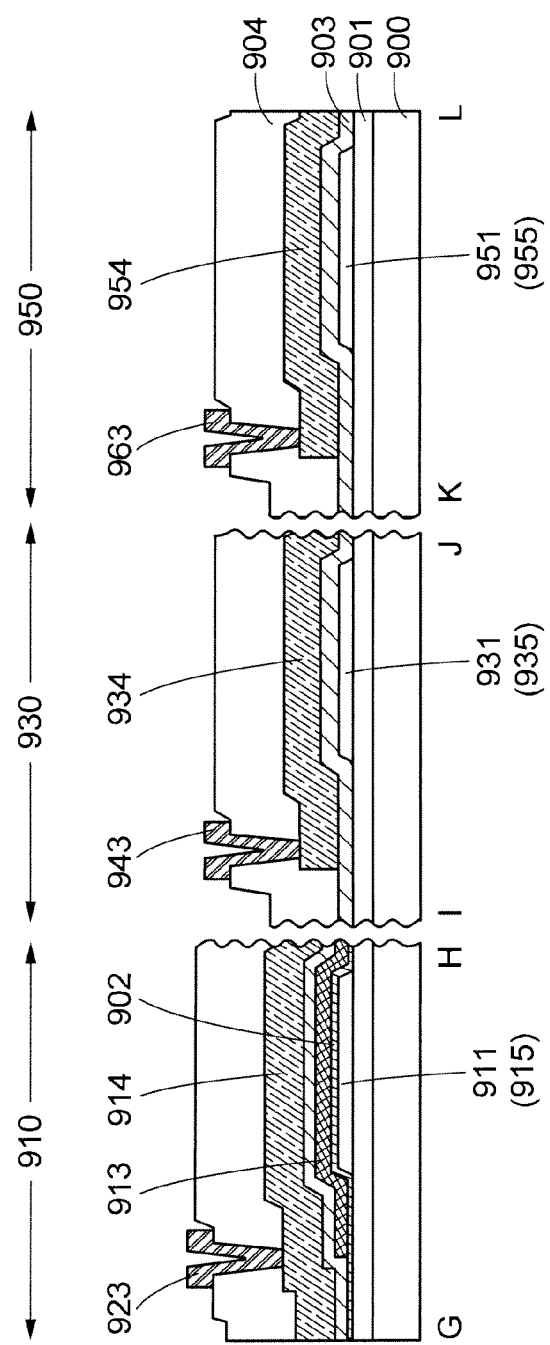
FIG. 18A PRIOR ART
FIG. 18B PRIOR ART

SEMICONDUCTOR DEVICE INCLUDING A NONVOLATILE MEMORY ELEMENT HAVING FIRST, SECOND AND THIRD INSULATING FILMS

BACKGROUND OF THE INVENTION

1. Field of the Invention

In this specification, a semiconductor device provided with a nonvolatile memory element capable of writing and erasing information will be described.

2. Description of the Related Art

A nonvolatile semiconductor memory device is a semiconductor device provided with a nonvolatile memory element capable of writing and erasing information, and is utilized as recording media of various electronic devices such as digital still cameras, portable audio players, and cellular phones. As typical nonvolatile semiconductor memory devices, EEPROM (Electrically Erasable and Programmable Read Only Memory) and a flash memory can be given.

Since electric charges of Fowler-Nordheim (F-N) tunneling current, a hot electron, and the like are used for rewriting a nonvolatile memory element which is applied to a nonvolatile semiconductor memory device, a tunnel insulating film of the nonvolatile memory element or an interface thereof deteriorates by repetition of rewriting. Therefore, theoretically, the rewritable number of the nonvolatile memory element has limitation. A variety of technologies have been developed regarding how to improve rewriting endurance of the nonvolatile memory element and as to an insulating film, an element structure, a rewriting method, and the like (for example, see Patent Documents 1 and 2).

In addition, in operational principle, a high driving voltage (a writing voltage and an erasing voltage) is necessary for rewriting of a nonvolatile memory element. Therefore, the nonvolatile semiconductor memory device is provided with a voltage generation circuit that generates a writing voltage and an erasing voltage and a circuit that needs a transistor which can withstand a high driving voltage. Thus, a plurality of semiconductor elements each having a different structure, such as a nonvolatile memory element, a transistor that can withstand a high driving voltage (hereinafter referred to as the "high withstand voltage transistor"), and a transistor applied to a circuit where high-speed operation is required, need to be manufactured at the same time using one substrate. For example, in Patent Document 3, it is described that a transistor having a thin gate insulating film and a transistor having a thick gate insulating film are manufactured at the same time over one substrate together with a nonvolatile memory element. In Patent Document 3, the transistor having a thin gate insulating film is applied to a transistor where a driving voltage is low and variation in a threshold voltage is desired to be suppressed, whereas the transistor having a thick gate insulating film is applied to a high withstand voltage transistor.

An example of a structure of the nonvolatile memory element disclosed in Patent Document 3 will be described below with reference to FIGS. 14A and 14B. FIGS. 14A and 14B are each a cross-sectional view of a nonvolatile memory element 910 disclosed in Patent Document 3. FIG. 14A is a cross-sectional view taken along a channel length direction (in a direction perpendicular to a gate), and FIG. 14B is a cross-sectional view taken along a channel width direction (in a direction horizontal to the gate).

As illustrated in FIGS. 14A and 14B, the nonvolatile memory element 910 (hereinafter referred to as the "memory element 910") is provided over a glass substrate 900 with an insulating film 901 interposed therebetween. The glass substrate 900 is used as a substrate having an insulating surface. The memory element 910 includes an island-like semiconductor region 911 over the insulating film 901, and a floating gate electrode 913 and a control gate electrode 914 over the island-like semiconductor region 911.

The island-like semiconductor region 911 is provided with a channel formation region 915, a source region 916, a drain region 917, and LDD regions 918 and 919. An insulating film 902 is provided over the island-like semiconductor region 911, and the floating gate electrode 913 is provided over the island-like semiconductor region 911 with the insulating film 902 interposed therebetween. In addition, the control gate electrode 914 is provided over the floating gate electrode 913 with an insulating film 903 interposed therebetween. The insulating film 902 forms a gate insulating film between the island-like semiconductor region 911 and the floating gate electrode 913, and the insulating film 903 forms a gate insulating film between the floating gate electrode 913 and the control gate electrode 914. In this specification, in a nonvolatile memory element, the former gate insulating film is referred to as a first gate insulating film, and the latter gate insulating film is referred to as a second gate insulating film.

An insulating film 904 is provided so as to cover the island-like semiconductor region 911, the floating gate electrode 913, and the control gate electrode 914. A wiring 921, a wiring 922, and a wiring 923 are formed over the insulating film 904 and are electrically connected to the source region 916 and the drain region 917 of the island-like semiconductor region 911, and the control gate electrode 914, respectively, through contact holes.

Next, an example of a method for manufacturing a nonvolatile semiconductor memory device which is disclosed in Patent Document 3 will be described with reference to FIGS. 15A to 15C, FIGS. 16A and 16B, FIGS. 17A and 17B, and FIGS. 18A and 18B. Here, a method for manufacturing an n-channel transistor 930 and a p-channel transistor 950 over the glass substrate 900 is described together with the memory element 910 illustrated in FIGS. 14A and 14B. Here, the transistors 930 and 950 are manufactured as transistors having a high withstand voltage. FIGS. 15A to 15C, FIGS. 16A and 16B, and FIGS. 17A and 17B are cross-sectional views which illustrate an example of a method for manufacturing the memory element 910, the n-channel transistor 930, and the p-channel transistor 950. Note that FIGS. 15A to 15C, FIGS. 16A and 16B, and FIGS. 17A and 17B are cross-sectional views of each element in a channel length direction, and the memory element 910, the n-channel transistor 930 (hereinafter referred to as the "transistor 930"), and the p-channel transistor 950 (hereinafter referred to as the "transistor 950") are illustrated in line A-B, line C-D, and line E-F, respectively. In addition, FIGS. 18A and 18B are cross-sectional views of each element in a channel width direction, and the memory element 910, the transistor 930, and the transistor 950 are illustrated in line G-H, line I-J, and line K-L, respectively.

As illustrated in FIG. 15A and FIG. 18A, the insulating film 901 is formed over the glass substrate 900. The island-like semiconductor region 911, an island-like semiconductor region 931, and an island-like semiconductor region 951 which each include a silicon film are formed over the insulating film 901. The insulating film 902 and a conductive film 981 are stacked over these regions (911, 931, and 951).

Next, as illustrated in FIG. 15B, the conductive film 981 is processed into a desired shape, so that the floating gate electrode 913 is formed over the island-like semiconductor region 911 with the insulating film 902 interposed therebetween. Next, the insulating film 902 is removed from the region where the transistors 930 and 950 are to be formed. The insulating film 902 which exists between the island-like semiconductor region 911 and the floating gate electrode 913 forms the first gate insulating film.

Next, as illustrated in FIG. 15C, an n-type impurity element is added to form LDD (Lightly Doped Drain) regions in the island-like semiconductor regions 911 and 931. This addition of an impurity element is performed after a resist which covers the island-like semiconductor region 951 is formed by a photolithography step. Through this step of adding an impurity element, n-type low concentration impurity regions 982 to 985 are formed in the island-like semiconductor regions 911 and 931. Next, the insulating film 903 is formed so as to cover the island-like semiconductor regions 911, 931, and 951. This insulating film 903 forms the second gate insulating film between the floating gate electrode 913 and the control gate electrode 914 in the memory element 910 and forms gate insulating films in the transistors 930 and 950. Therefore, it is preferable to provide the insulating film 903 as an insulating film thicker than the insulating film 902 so that the transistors 930 and 950 have a dielectric strength voltage with respect to a high driving voltage.

Next, a conductive film is formed over the insulating film 903. This conductive film is processed into a desired shape, so that the control gate electrode 914 of the memory element 910 and a gate electrode 934 of the transistor 930 and a gate electrode 954 of the transistor 950 are formed (see FIG. 16A).

Next, as illustrated in FIG. 16B, a photolithography step is performed to form a resist 986 which covers the island-like semiconductor region 951. Then, an n-type impurity element is added to the island-like semiconductor regions 911 and 931 using the control gate electrode 914 and the gate electrode 934 as masks. Through this step, the channel formation region 915, the source region 916, the drain region 917, and the LDD regions 918 and 919 are formed in the island-like semiconductor region 911; and a channel formation region 935, a source region 936, a drain region 937, and LDD regions 938 and 939 are formed in the island-like semiconductor region 931.

Then, as illustrated in FIG. 17A, a resist 987 which covers the island-like semiconductor regions 911 and 931 is formed by a photolithography step. Next, a p-type impurity element is added to the island-like semiconductor region 951 using the gate electrode 954 as a mask. Through this step, a channel formation region 955, a source region 956, and a drain region 957 are formed in the island-like semiconductor region 951 in a self-aligned manner.

Next, as illustrated in FIG. 17B and FIG. 18B, the insulating film 904 is formed to form a plurality of contact holes in the insulating films 904, 903, and 902. Then, a conductive film is formed over the insulating film 904 and processed into a desired shape. Accordingly, the wirings 921 to 923 electrically connected to the memory element 910, wirings 941 to 943 electrically connected to the transistor 930, and wirings 961 to 963 electrically connected to the transistor 950 are formed. Through the above-described steps, the memory element 910, the transistor 930, and the transistor 950 are completed (see FIG. 17B and FIG. 18B).

As illustrated in FIG. 17B and FIG. 18B, the second gate insulating film of the memory element 910 and the gate insulating films of the transistors 930 and 950 are formed using the common insulating film 903. It is preferable to provide the insulating film 903 with a film thickness thick enough to withstand a high driving voltage so that the transistors 930 and 950 each have a structure suitable for a high withstand voltage transistor. On the other hand, since the insulating film 903 serves as the second gate insulating film between the floating gate electrode 913 and the control gate electrode 914, a rewriting voltage of the memory element 910 increases when the film thickness of the insulating film 903 is increased. In addition, rewriting endurance of the memory element 910 is easily affected by dielectric strength characteristics of the insulating film 903 and an interface state between the island-like semiconductor region 911 and the insulating film 903.

REFERENCE

Patent Document

[Patent Document 1] Japanese Published Patent Application No. H5-304300
[Patent Document 2] Japanese Published Patent Application No. H8-130258
[Patent Document 3] Japanese Published Patent Application No. 2007-288176

SUMMARY OF THE INVENTION

An object of an embodiment of the present invention is to facilitate provision of a nonvolatile memory element and a transistor having a structure suitable for driving with a high driving voltage over one substrate.

A nonvolatile semiconductor memory device according to one embodiment of the present invention is provided with a memory cell array which includes a nonvolatile memory element and a driver circuit portion which is electrically connected to the memory cell array and includes a transistor. The nonvolatile memory element of the memory cell array includes a first island-like semiconductor region in which a first channel formation region, and a first source region and a first drain region including a first impurity element imparting conductivity are formed; a floating gate electrode; a control gate electrode; a first gate insulating film which exists between the first island-like semiconductor region and the floating gate electrode and in which a thin film region where a film thickness is small in a portion overlapping at least with a central portion of the first channel formation region is formed; and a second gate insulating film which exists between the floating gate electrode and the control gate electrode. In addition, the transistor of the driver circuit portion includes a second island-like semiconductor region in which a second channel formation region, and a second source region and a second drain region including a second impurity element imparting conductivity are formed; a gate electrode; and a third gate insulating film which exists between the second island-like semiconductor region and the gate electrode.

Further, the nonvolatile semiconductor memory device according to the above embodiment includes a substrate; the first island-like semiconductor region and the second island-like semiconductor region which are formed over the substrate; a first insulating film which is formed over the first island-like semiconductor region and the second island-like semiconductor region and which is included in the first gate insulating film and the third gate insulating film but not included in the thin film region; a second insulating film which is formed over the first insulating film and which is included in the first gate insulating film and the third gate insulating film; an opening which is formed in a portion where the first insulating film overlaps with the first island-like semiconductor region so as to form the thin film region in the first gate insulating film; the floating gate electrode which is formed over the first island-like semiconductor region with the first insulating film and the second insulating film interposed therebetween and which overlaps with the opening; a first conductive film which is formed over the second island-like semiconductor region with the first insulating film and the second insulating film interposed therebetween and which is included in the gate electrode; a third insulating film which is formed over the first conductive film and the floating gate electrode and which is included in the second gate insulating film; the control gate electrode which is formed over the floating gate electrode with the third insulating film interposed therebetween; and a second conductive film which is formed over the third insulating film and which is electrically connected to the first conductive film and included in the gate electrode.

A method for manufacturing a nonvolatile semiconductor memory device according to another embodiment of the present invention is a method for manufacturing a nonvolatile semiconductor memory device provided with a memory cell array which includes a nonvolatile memory element and a driver circuit portion which is electrically connected to the memory cell array and includes a transistor. The method for manufacturing a nonvolatile semiconductor memory device according to the embodiment includes the steps of forming a first island-like semiconductor region of the nonvolatile memory element and a second island-like semiconductor region of the transistor over a substrate; forming a first insulating film over the first island-like semiconductor region and the second island-like semiconductor region; forming an opening in a portion where the first insulating film overlaps with the first island-like semiconductor region; forming a second insulating film over the first insulating film where the opening is formed; forming a first conductive film over the second insulating film so that a floating gate electrode of the nonvolatile memory element, which overlaps with the opening, and a second conductive film included in a gate electrode of the transistor are formed from the first conductive film over the second insulating film; forming a third insulating film over the second conductive film and the floating gate electrode; forming a third conductive film over the third insulating film so that a control gate electrode of the nonvolatile memory element and a fourth conductive film included in the gate electrode of the transistor are formed from the third conductive film over the third insulating film; and forming a fifth conductive film which electrically connects the second conductive film and the fourth conductive film. Further, in the method for manufacturing a nonvolatile semiconductor memory device according to the embodiment, the first insulating film and the second insulating film are a gate insulating film between the floating gate electrode and the first island-like semiconductor region and insulating films included in a gate insulating film of the transistor. Moreover, the opening is formed in the first insulating film, whereby the thin film region having a small film thickness is formed in the gate insulating film between the floating gate electrode and the first island-like semiconductor region.

In a nonvolatile semiconductor memory device according to one embodiment of the present invention, a second gate insulating film formed between a control gate electrode and a floating gate electrode in a nonvolatile memory element and a gate insulating film in a transistor are formed using a different insulating film. With such an embodiment, it becomes easier to make the film thickness of the gate insulating film in the transistor different from the film thickness of the second gate insulating film in the nonvolatile memory element, whereby the nonvolatile memory element and the transistor can be manufactured over one substrate without increase in limitation of the manufacturing process. For example, it becomes easier to provide the nonvolatile memory element and a transistor having a structure suitable for driving with a high driving voltage over one substrate.

BRIEF DESCRIPTION OF THE DRAWINGS

In the accompanying drawings:

FIG. 3 is a block diagram illustrating an example of a structure of a nonvolatile semiconductor memory device according to one embodiment of the present invention;

FIG. 4 is a circuit diagram illustrating an example of a structure of a memory cell included in a nonvolatile semiconductor memory device according to one embodiment of the present invention;

FIGS. 5A to 5D are cross-sectional views (channel length direction) illustrating an example of a method for manufacturing a nonvolatile semiconductor memory device according to one embodiment of the present invention;

FIGS. 6A to 6C are cross-sectional views (channel length direction) illustrating steps subsequent to FIG. 5D;

FIGS. 7A to 7C are cross-sectional views (channel length direction) illustrating steps subsequent to FIG. 6C;

FIGS. 15A to 15C are cross-sectional views illustrating an example of a method for manufacturing a nonvolatile semiconductor memory device illustrated in FIGS. 14A and 14B;

FIGS. 18A and 18B are, respectively, a cross-sectional view illustrating the same step as FIG. 15A and a cross-sectional view illustrating the same step as FIG. 17B, which are in a channel width direction of a nonvolatile semiconductor memory device.

DETAILED DESCRIPTION OF THE INVENTION

Figure 1A:
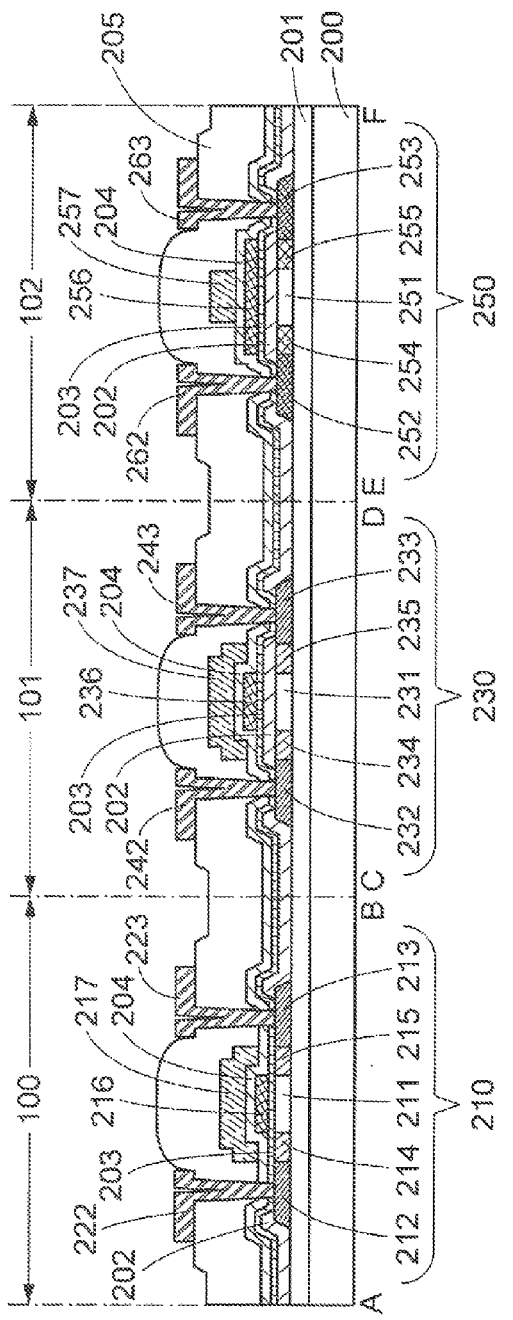
FIGS. 1A and 1B are, respectively, a cross-sectional view in a channel length direction and a cross-sectional view in a channel width direction, which illustrate an example of a structure of a nonvolatile semiconductor memory device according to one embodiment of the present invention.

Embodiments and an example of the invention which is disclosed in this specification will be hereinafter described with reference to the accompanying drawings. It is easily understood by those skilled in the art that modes of the invention which is disclosed in this specification can be modified in various ways without being limited to the description in the embodiments and example. Therefore, the invention disclosed in this specification should not be interpreted as being limited to the description of the embodiments and example. Note that in the drawings referred to in this specification, components denoted by the same reference numerals in different drawings represent the same components. Therefore, the description regarding such components, which are repetitive, will be omitted in some cases.

Embodiment 1

Figure 1B:
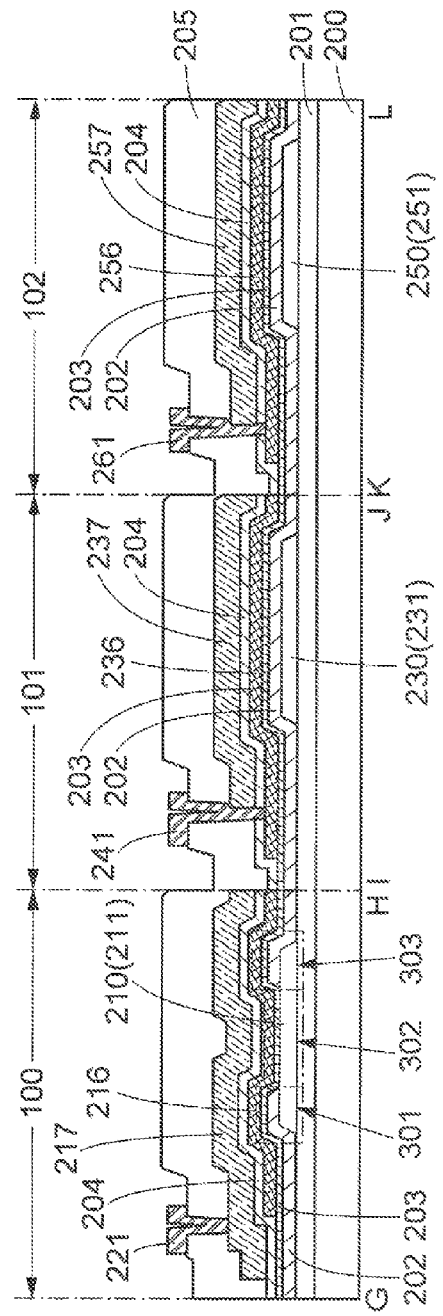
Figure 2A:
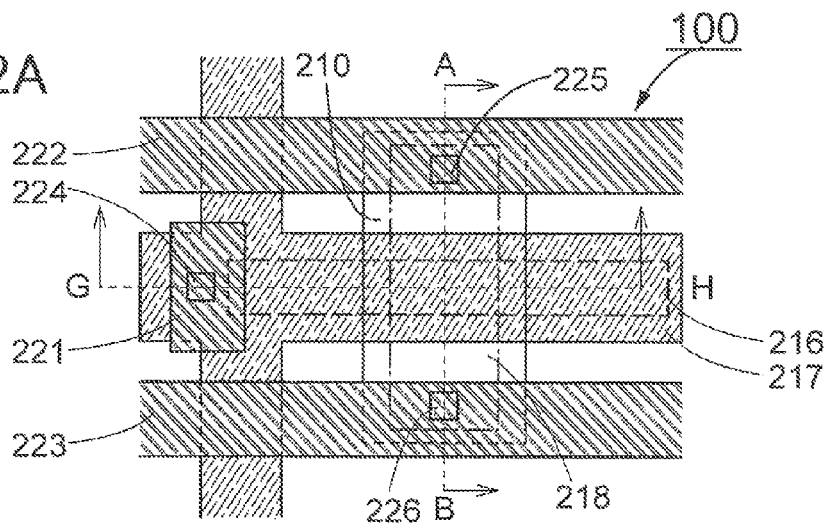
FIGS. 2A, 2B, and 2C are, respectively, a plan view illustrating an example of a structure of a nonvolatile memory element, a plan view illustrating an example of a structure of a transistor, and a plan view illustrating an example of a structure of another transistor, which are included in a nonvolatile semiconductor memory device according to one embodiment of the present invention.
Figure 2B:
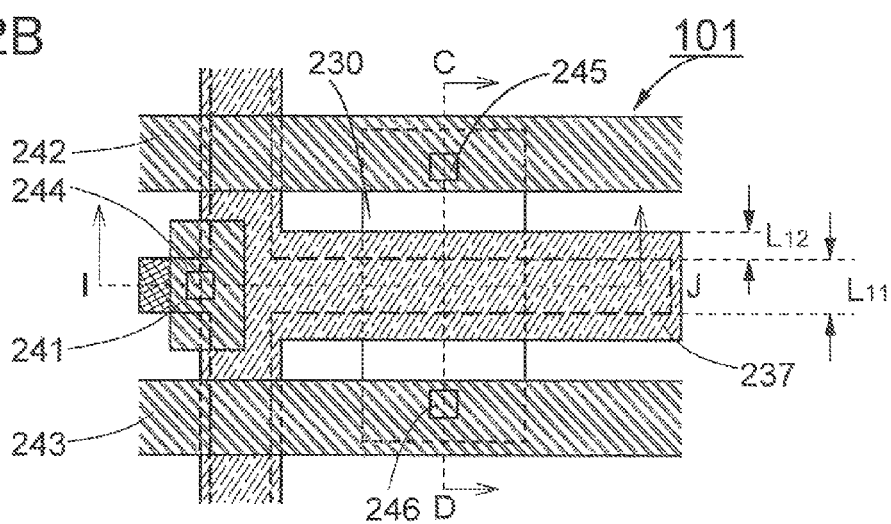
Figure 2C:
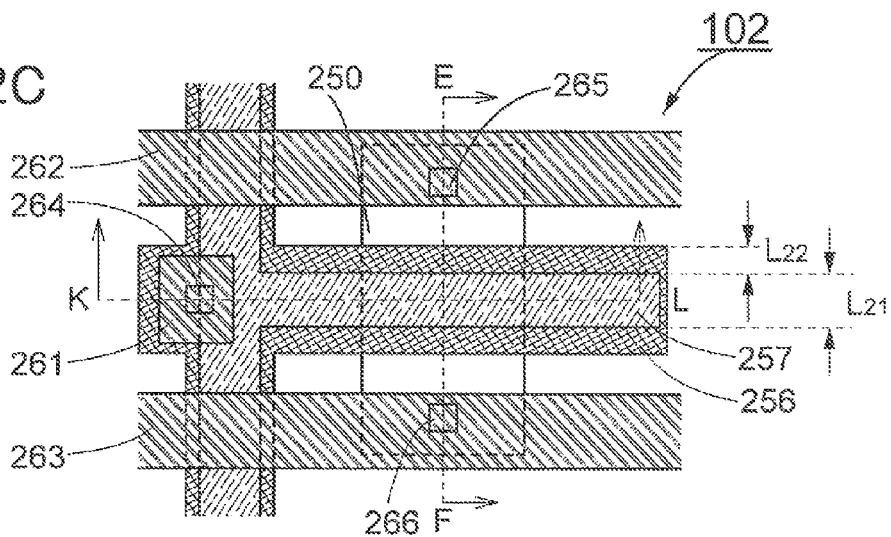

In this embodiment, a nonvolatile semiconductor memory device will be described. The nonvolatile semiconductor memory device of this embodiment includes, over one substrate, a nonvolatile memory element and at least two kinds of transistors having different structures. FIGS. 1A and 1B are cross-sectional views and FIGS. 2A to 2C are plan views, which illustrate an example of a structure of the nonvolatile semiconductor memory device of this embodiment. FIGS. 1A and 1B are each a cross-sectional view of a typical portion of the nonvolatile semiconductor memory device of this embodiment, which each illustrate cross sections of a nonvolatile memory element 100, and transistors 101 and 102. The nonvolatile memory element 100 is formed as an n-channel memory transistor. In addition, in this embodiment, the transistors 101 and 102 are each provided as a high withstand voltage transistor, and the transistor 101 serves as an n-channel transistor and the transistor 102 serves as a p-channel transistor.

In addition, FIG. 2A is a plan view of the nonvolatile memory element 100. A cross-sectional view taken along line A-B of FIG. 2A is illustrated in FIG. 1A, and a cross-sectional view taken along line G-H of FIG. 2A is illustrated in FIG. 1B. Moreover, FIG. 2B is a plan view of the transistor 101. A cross-sectional view taken along line C-D of FIG. 2B is illustrated in FIG. 1A, and a cross-sectional view taken along line I-J of FIG. 2B is illustrated in FIG. 1B. Further, FIG. 2C is a plan view of the transistor 102. A cross-sectional view taken along line E-F of FIG. 2C is illustrated in FIG. 1A, and a cross-sectional view taken along line K-L of FIG. 2C is illustrated in FIG. 1B. In other words, FIG. 1A is a cross-sectional view taken along a channel length direction (a direction perpendicular to a gate) of the nonvolatile memory element 100, and the transistors 101 and 102, whereas FIG. 1B is a cross-sectional view taken along a channel width direction (a direction horizontal to the gate) of these semiconductor elements.

Further, FIG. 3 is a block diagram illustrating an example of a structure of the nonvolatile semiconductor memory device of this embodiment, and FIG. 4 is a circuit diagram illustrating an example of a structure of a memory cell provided for the nonvolatile semiconductor memory device of this embodiment.

First, the structure of a nonvolatile semiconductor memory device 10 of this embodiment will be described with reference to FIG. 3. The nonvolatile semiconductor memory device 10 includes a memory cell array 11 and a driving circuit portion 12 electrically connected to the memory cell array 11 and controlling a writing operation, an erasing operation, a reading operation, and the like. The memory cell array 11 and the driver circuit portion 12 are provided over one substrate.

The driving circuit portion 12 includes a control circuit 20 which is configured to control circuits included in the driving circuit portion 12, a row decoder 21 which is configured to select a word line, a column decoder 22 which is configured to select a bit line, an address buffer 23, a step-up circuit 24, a sense amplifier 25, a data buffer 26, and a data input-output buffer 27.

The address data Add specifies the address of a memory cell in which data is written, read, or erased. Address data Add is inputted to the control circuit 20 via the address buffer 23. When the address data Add is inputted to the control circuit 20, an inner row address signal and an inner column address signal are generated by the control circuit 20 to be outputted to the row decoder 21 and the column decoder 22, respectively.

In the nonvolatile semiconductor memory device 10, a voltage obtained by increase of a power supply voltage is to be used for a driving voltage in order to write and erase data. Thus, the control circuit 20 controls the step-up circuit 24 so that a voltage corresponding to an operation is generated by the step-up circuit 24. An output of the step-up circuit 24 is supplied to a word line and a bit line formed in the memory cell array 11 via the row decoder 21 and the column decoder 22, respectively.

Data (DATA) read from the memory cell array 11 is inputted to the sense amplifier 25 via the column decoder 22. The data (DATA) inputted to the sense amplifier 25 is retained in the data buffer 26. The control circuit 20 controls the data buffer 26 so that the data retained in the data buffer 26 is outputted from the nonvolatile semiconductor memory device 10 via the data input-output buffer 27. Data (DATA) written to the memory cell array 11 is temporarily retained in the data buffer 26 via the data input-output buffer 27, and then transferred to the column decoder 22 under the control of the control circuit 20. Then, the data (DATA) is written from the column decoder 22 to a specified memory cell of the memory cell array 11.

Next, an example of the structure of the memory cell array 11 is described with reference to FIG. 4. The memory cell array 11 includes a plurality of memory cells 40 arranged in matrix, a plurality of word lines WLs, and a plurality of bit lines BLs and source lines SLs which are intersected with the word lines WLs. Each memory cell 40 is electrically connected to the bit lines BLs, the source lines SLs, and the word lines WLs. FIG. 4 illustrates six memory cells 40 arranged in three rows and two columns. The memory cell 40 is a basic element to store data and include the nonvolatile memory element 100 which is configured to store data. In the memory cell 40, the control gate electrode of the nonvolatile memory element 100 is electrically connected to the word line WL, a drain region thereof is electrically connected to the bit line BL, and a source region thereof is electrically connected to the source line SL.

The structures of the nonvolatile memory element 100 (hereinafter referred to as the "memory element 100") and the transistors 101 and 102 which are included in the nonvolatile semiconductor memory device 10 is described below with reference to FIGS. 1A and 1B and FIGS. 2A to 2C. The transistors 101 and 102 are each a semiconductor element which is applied to a high withstand voltage transistor in the driver circuit portion 12 of the nonvolatile semiconductor memory device 10 in FIG. 3.

As illustrated in FIGS. 1A and 1B, the memory element 100 and the transistors 101 and 102 are formed over one substrate 200 with an insulating film 201 interposed therebetween. Over the insulating film 201, an island-like semiconductor region 210, an island-like semiconductor region 230, and an island-like semiconductor region 250 which form the memory element 100, the transistor 101, and the transistor 102, respectively, are provided. A stacked film of insulating films 202 and 203 is provided so as to cover the island-like semiconductor regions 210, 230, and 250. The insulating films 202 and 203 each may have a single-layer structure or a stacked structure.

First, the structure of the memory element 100 is described. Then, the structures of the transistor 101 and the transistor 102 are described in order.

The island-like semiconductor region 210 of the memory element 100 is provided with a channel formation region 211, n-type high concentration impurity regions 212 and 213, and n-type low concentration impurity regions 214 and 215. One of the n-type high concentration impurity regions 212 and 213 serves as a source region, and the other thereof serves as a drain region. The n-type low concentration impurity regions 214 and 215 are regions where the concentration of an impurity element imparting n-type conductivity is lower than that of the n-type high concentration impurity regions 212 and 213. With the concentration of the impurity element adjusted, these n-type low concentration impurity regions 214 and 215 can function as LDD regions or high resistant regions. The n-type low concentration impurity regions 214 and 215 are made to function as such regions, whereby resistance of the memory element 100 to hot carrier can be improved.

A conductive film 216 is provided over the island-like semiconductor region 210 with the stacked film of the insulating films 202 and 203 interposed therebetween. The conductive film 216 forms a floating gate electrode of the memory element 100. In addition, as illustrated in FIG. 2A, an opening 218 is formed in a portion of the insulating film 202, which overlaps with the channel formation region 211 of the island-like semiconductor region 210. The stacked film of the insulating films 202 and 203 forms a first gate insulating film (an insulating film between the island-like semiconductor region and the floating gate electrode) of the memory element 100.

An insulating film 204 is formed over the conductive film 216. A conductive film 217 overlapping with the conductive film 216 with the insulating film 204 interposed therebetween is formed. The conductive film 217 forms the word line WL and the control gate electrode of the memory element 100. The insulating film 204 forms a second gate insulating film (an insulating film between the floating gate electrode and the control gate electrode) of the memory element 100.

An insulating film 205 is formed over the conductive film 217. Conductive films 221, 222, and 223 are formed over the insulating film 205. As illustrated in FIG. 2A, the conductive film 221 is in close contact with the conductive film 217 through a contact hole 224 formed in the insulating film 205. The conductive films 222 and 223 are, respectively, in close contact with the n-type high concentration impurity regions 212 and 213 through contact holes 225 and 226 formed in the insulating films 203 to 205. One of the conductive films 222 and 223 forms a bit line BL, and the other thereof forms a source line SL.

As illustrated in FIG. 2A, the planar shape of the conductive film 216 is narrower than that of the conductive film 217, and the end portion of the conductive film 216 exists on the inner side of the end portion of the conductive film 217. In addition, as illustrated in FIG. 1A, the length of the conductive film 216 in a channel length direction is shorter than that of the conductive film 217 in a portion overlapping with the island-like semiconductor region 210, and the island-like semiconductor region 210 includes a region overlapping with both of the conductive films 216 and 217 and a region overlapping only with the conductive film 217. In this embodiment, the channel formation region 211 is formed in the former region, and the n-type low concentration impurity regions 214 and 215 are formed in the latter region. Further, the n-type high concentration impurity regions 212 and 213 are formed in a region overlapping with neither the conductive film 216 nor the conductive film 217 of the island-like semiconductor region 210.

In the memory element 100, the first gate insulating film between the floating gate electrode (the conductive film 216) and the island-like semiconductor region 210 is formed with the stacked film of the insulating films 202 and 203. Note that since the opening 218 is formed in the insulating film 202, the first gate insulating film has a thin film region having a small film thickness and a thick film region having a thick film thickness. The thin film region is a region where only the insulating film 203 exists, whereas the thick film region is a region where the stacked film of the insulating films 202 and 203 exists. In the rewriting operation of data of the memory element 100, electric charges are injected into and extracted from the floating gate electrode (the conductive film 216) through the thin film region of the first gate insulating film.

Therefore, the opening 218 is formed so as to remove at least a region where the central portion of the channel formation region 211 of the insulating film 202 overlaps with the floating gate electrode (the conductive film 216). That is, the opening 218 is formed in the insulating film 202 so that a portion where the thin film region overlaps with the channel formation region 211 is at least included. Note that in terms of a dielectric strength voltage or the like, it is preferable to form the opening 218 so as not to remove the insulating film 202 over the end portion (step portion) of the island-like semiconductor region 210. In this embodiment, in both a channel length direction and a channel width direction, the insulating film 202 over the island-like semiconductor region 210 is removed, except for the insulating film 202 over the end portion (step portion) of the island-like semiconductor region 210, whereby the opening 218 is formed (see FIGS. 1A and 1B, FIG. 2A, and FIG. 5B).

With the opening 218 formed in the insulating film 202 in this manner, the first gate insulating film between the floating gate electrode (the conductive film 216) and the island-like semiconductor region 210 includes the thick film region with the stack of the insulating films 202 and 203 over the end portion of the island-like semiconductor region 210 and a thin film region including only the insulating film 203 in the other regions. This thin film region substantially functions as a tunnel insulating film of the memory element 100. With such a structure of the first gate insulating film, rewriting endurance of the memory element 100 can be improved.

Next, the structure of the transistor 101 is described with reference to FIGS. 1A and 1B and FIG. 2B.

The island-like semiconductor region 230 of the transistor 101 is provided with a channel formation region 231, n-type high concentration impurity regions 232 and 233, and n-type low concentration impurity regions 234 and 235. One of the n-type high concentration impurity regions 232 and 233 serves as a source region of the transistor 101, and the other thereof serves as a drain region of the transistor 101. The n-type low concentration impurity regions 234 and 235 are regions where the concentration of an impurity element imparting n-type conductivity is lower than that of the n-type high concentration impurity regions 232 and 233. With the concentration of the impurity element adjusted, these n-type low concentration impurity regions 234 and 235 can function as LDD regions or high resistant regions or further as a source region or a drain region.

A conductive film 236 is formed over the island-like semiconductor region 230 with the stacked film of the insulating films 202 and 203 interposed therebetween. A conductive film 237 is formed over the conductive film 236 with the insulating film 204 interposed therebetween. The insulating film 205 is formed over the conductive film 237, and conductive films 241 to 243 are fanned over the insulating film 205. The conductive film 241 is electrically connected to the conductive films 236 and 237 through a contact hole 244 formed in the insulating films 204 and 205. The conductive films 242 and 243 are electrically connected to the n-type high concentration impurity regions 232 and 233 through contact holes 245 and 246 formed in the insulating films 203 to 205. One of the conductive films 242 and 243 forms a source line (or a source electrode), and the other thereof forms a drain line (or a drain electrode).

As illustrated in FIG. 2B, the planar shape of the conductive film 236 is narrower than that of the conductive film 237, and the end portion of the conductive film 236 exists on the inner side of the end portion of the conductive film 237. Therefore, as illustrated in FIG. 1A, the length of the conductive film 236 in a channel length direction is shorter than that of the conductive film 237 in a portion overlapping with the island-like semiconductor region 230; accordingly, the island-like semiconductor region 230 includes a region overlapping with both of the conductive films 236 and 237 and a region overlapping only with the conductive film 237. In this embodiment, the channel formation region 231 is formed in the former region, and the n-type low concentration impurity regions 234 and 235 are formed in the latter region. Further, the n-type high concentration impurity regions 232 and 233 are formed in a region overlapping with neither the conductive film 236 nor the conductive film 237 of the island-like semiconductor region 230.

Since the conductive films 236 and 237 are electrically connected to each other through the conductive film 241, these films together form a gate electrode of the transistor 101. The conductive film 236 can be made to function mainly as the gate electrode. Moreover, the stacked film of the insulating films 202 and 203, which exists between the conductive film 236 and the island-like semiconductor region 230, forms a gate insulating film. In this manner, in this embodiment, the transistor 101 has a stacked structure similar to that of the memory element 100, so that the transistor 101 and the memory element 100 are easily manufactured at the same time.

In this embodiment, the stacked film of the insulating films 202 and 203 is applied to the gate insulating film of the transistor 101, whereby the gate insulating film can be formed using a film different from the second gate insulating film of the memory element 100. Thus, the transistor 101 can easily have a structure suitable for a high withstand voltage transistor without increase in a writing voltage of the memory element 100.

Further, in this embodiment, the stacked film of the insulating films 202 and 203 is applied to the gate insulating film of the transistor 101 and the thick film region of the first gate insulating film of the memory element 100, and only the insulating film 203 is applied to the thin film region of the first gate insulating film of the memory element 100. With such a structure, the gate insulating film of the transistor 101 can be formed thick without increase in thickness of the tunnel insulating film of the memory element 100. That is, according to this embodiment, the transistor 101 can easily have a structure suitable for a high withstand voltage transistor without influence on the performance of the memory element 100.

Further, the transistor 101 can easily have a structure suitable for a high withstand voltage transistor even in such a manner that the insulating film 202 is removed from the region where the memory element 100 is formed, so that the first gate insulating film is formed only with the insulating film 203, whereas the gate insulating film of the transistor 101 is formed with the stacked film of the insulating films 202 and 203. Note that in terms of rewriting endurance of the memory element 100, it is preferable to form the thick film region and the thin film region in the first gate insulating film of the memory element 100 as illustrated in FIGS. 1A and 1B.

Moreover, the channel length of the transistor 101 can be adjusted in accordance with a length $L_{11}$, in a channel length direction (a direction taken along C-D of FIG. 2B) of a portion of the conductive film 236, which exists over the island-like semiconductor region 230 (see FIG. 2B). The transistor 101 can have a structure suitable for a high withstand voltage transistor by increase of the length $L_{11}$. In this embodiment, it is preferable that the channel length of the transistor 101 be longer than that of the memory element 100.

In addition, the n-type low concentration impurity regions 234 and 235 are provided as LDD regions (high resistant regions) overlapping with the conductive film 237, whereby resistance of the transistor 101 to hot carrier can be improved. Since the insulating film 204 as well as the insulating films 202 and 203 exists in a portion where the n-type low concentration impurity regions 234 and 235 overlap with the gate electrode (the conductive film 237) of the transistor 101, the gate capacitance can be reduced. Accordingly, switching of the transistor 101 can be performed at high speed as compared to a transistor having the same channel length.

In addition, the length in a channel length direction of the n-type low concentration impurity regions 234 and 235 is increased, whereby resistance of the transistor 101 to hot carrier can be improved. The length thereof can be determined by the structure of the conductive films 236 and 237. More specifically, the length in a channel length direction of the these n-type low concentration impurity regions 234 and 235 can be adjusted in accordance with a distance between the end surface of the conductive film 237 and the end surface of the conductive film 236 in a direction taken along line C-D (hereinafter the length is referred to as the "length $L_{12}$"). Thus, resistance of the transistor 101 to hot carrier can be improved by increase of the length $L_{12}$.

Note that the transistor 101 is not limited to the transistor which is manufactured at the same time as the memory element 100, and can be applied to a semiconductor device which does not include the memory element 100. The gate electrode is formed with the conductive films 236 and 237, whereby the channel formation region 231, the n-type high concentration impurity regions 232 and 233, and the n-type low concentration impurity regions 234 and 235 are formed in the island-like semiconductor region 230 in a self-aligned manner.

Next, the structure of the transistor 102 is described with reference to FIGS. 1A and 1B and FIG. 2C.

The island-like semiconductor region 250 of the transistor 102 is provided with a channel formation region 251, p-type high concentration impurity regions 252 and 253, and p-type low concentration impurity regions 254 and 255. One of the p-type high concentration impurity regions 252 and 253 serves as a source region of the transistor 102, and the other thereof serves as a drain region of the transistor 102. The p-type low concentration impurity regions 254 and 255 are regions where the concentration of an impurity element imparting p-type conductivity is lower than that of the p-type high concentration impurity regions 252 and 253. With the concentration of the impurity element adjusted, these p-type low concentration impurity regions 254 and 255 can function as LDD regions or high resistant regions or further as a source region or a drain region.

A conductive film 256 is formed over the island-like semiconductor region 250 with the stacked film of the insulating films 202 and 203 interposed therebetween. A conductive film 257 is formed over the conductive film 256 with the insulating film 204 interposed therebetween. The insulating film 205 is formed over the conductive film 257, and conductive films 261 to 263 are formed over the insulating film 205. The conductive film 261 is electrically connected to the conductive films 256 and 257 through a contact hole 264 formed in the insulating film 205. The conductive films 262 and 263 are electrically connected to the p-type high concentration impurity regions 252 and 253 through contact holes 265 and 266 formed in the insulating films 203 to 205. One of the conductive films 262 and 263 forms a source line (or a source electrode), and the other thereof forms a drain line (or a drain electrode).

As illustrated in FIG. 2C, the planar shape of the conductive film 257 is narrower than that of the conductive film 256, and the end portion of the conductive film 257 exists on the inner side of the end portion of the conductive film 256. In addition, as illustrated in FIG. 1A, the length of the conductive film 257 in a channel length direction is shorter than that of the conductive film 256 in a portion overlapping with the island-like semiconductor region 250; accordingly, the island-like semiconductor region 250 includes a region overlapping with both of the conductive films 256 and 257 and a region overlapping only with the conductive film 256. In this embodiment, the channel formation region 251 is formed in the former region, and the p-type low concentration impurity regions 254 and 255 are formed in the latter region. Further, the p-type high concentration impurity regions 252 and 253 are formed in a region overlapping with neither the conductive film 256 nor the conductive film 257 of the island-like semiconductor region 250.

The conductive films 256 and 257 are electrically connected to each other, and form a gate electrode of the transistor 102. In this embodiment, the conductive film 256 mainly functions as the gate electrode. Moreover, the stacked film of the insulating films 202 and 203, which exists between the conductive film 256 and the island-like semiconductor region 250, forms a gate insulating film. In this manner, in this embodiment, the transistor 102 has a stacked structure similar to that of the memory element 100, so that the transistor 102 and the memory element 100 are easily manufactured at the same time.

In this embodiment, the stacked film of the insulating films 202 and 203 is applied to the gate insulating film of the transistor 102, whereby the gate insulating film can be formed using a film different from the second gate insulating film of the memory element 100. Thus, the transistor 102 can easily have a structure suitable for a high withstand voltage transistor without increase in a writing voltage of the memory element 100.

Further, in this embodiment, the transistor 102 can easily have a structure suitable for a high withstand voltage transistor without influence on the performance of the memory element 100 even in such a manner that the insulating film 202 is removed from the region where the memory element 100 is formed, so that the first gate insulating film is formed only with the insulating film 203, whereas the gate insulating film of the transistor 102 is formed with the stacked film of the insulating films 202 and 203. Note that in terms of rewriting endurance of the memory element 100, it is preferable to form the thick film region and the thin film region in the first gate insulating film of the memory element 100 as illustrated in FIGS. 1A and 1B.

Further, in this embodiment, the stacked film of the insulating films 202 and 203 is applied to the gate insulating film of the transistor 102 and the thick film region of the first gate insulating film of the memory element 100, and only the insulating film 203 is applied to the thin film region of the first gate insulating film of the memory element 100. With such a structure, the gate insulating film of the transistor 102 can be formed thick without increase in thickness of the tunnel insulating film of the memory element 100. That is, according to this embodiment, the transistor 102 can easily have a structure suitable for a high withstand voltage transistor without influence on the performance of the memory element 100.

Moreover, the channel length of the transistor 102 can be adjusted in accordance with a length $L_{21}$ in a channel length direction (a direction taken along E-F of FIG. 2C) of a portion of the conductive film 257, which exists over the island-like semiconductor region 250 (see FIG. 2C). The transistor 102 can have a structure suitable for a high withstand voltage transistor by increase of the length $L_{21}$. In this embodiment, it is preferable that the channel length of the transistor 102 be longer than that of the memory element 100.

In addition, the p-type low concentration impurity regions 254 and 255 are provided as LDD regions (high resistant regions) overlapping with the gate electrode (the conductive film 256), whereby resistance of the transistor 102 to hot carrier can be improved. Accordingly, the transistor 102 can have a structure suitable for a high withstand voltage transistor.

In addition, the length in channel length direction of the p-type low concentration impurity regions 254 and 255 is increased, whereby resistance of the transistor 102 to hot carrier can be improved. The length thereof can be determined by the structure of the conductive films 256 and 257. More specifically, the length in a channel length direction of the these p-type low concentration impurity regions 254 and 255 can be adjusted in accordance with a distance between the end surface of the conductive film 257 and the end surface of the conductive film 256 in a direction taken along line E-F (a channel length direction) (hereinafter the length is referred to as the "length $L_{22}$"). Thus, resistance of the transistor 102 to hot carrier can be improved by increase of the length $L_{22}$.

Note that the transistor 102 is not limited to the transistor which is manufactured at the same time as the memory element 100, and can be applied to a semiconductor device which does not include the memory element 100. The gate electrode is formed with the conductive films 256 and 257, whereby the channel formation region 251, the p-type high concentration impurity regions 252 and 253, and the p-type low concentration impurity regions 254 and 255 are formed in the island-like semiconductor region 250 in a self-aligned manner.

Next, a driving method of the nonvolatile semiconductor memory device 10 of FIG. 3 is described. Here, with reference to FIG. 4, an example of a writing operation and an erasing operation of data to and from the memory cell 40 specified by a bit line BL0 and a word line WL1 is described.

Storing of information on a nonvolatile memory element provided with a floating gate electrode is performed by change of the amount of electric charge accumulated in the floating gate electrode. When the nonvolatile memory element is an n-channel memory transistor, a writing operation serves as injection of electrons into the floating gate electrode, and an erasing operation serves as extraction of electrons from the floating gate electrode. Injection and extraction of electric charges into and from the floating gate electrode can be performed utilizing F-N (Fowler-Nordheim) tunneling current, a hot electron, or the like. A method for writing and erasing data of the memory element 100 is described below with an example of the case using F-N tunneling current.

At the time of writing data, such a positive voltage that becomes higher than a potential of the island-like semiconductor region 210 is applied to the control gate electrode (217) of the memory element 100 to form indirectly a high electric field between the floating gate electrode (216) and the island-like semiconductor region 210, whereby F-N tunneling current is generated therebetween. Through this F-N tunneling current, electrons are injected into the floating gate electrode (216) from the island-like semiconductor region 210. The threshold voltage of the memory element 100 is increased by injection of electrons. In this state, data "1" is stored in the memory cell 40. For example, in order to write data into the memory cell 40, a high voltage of negative polarity is applied to a source line SL0 and the bit line BL0, and a high voltage of positive polarity is applied to the word line WL1. The potential difference between the high voltage of negative polarity and the high voltage of positive polarity is a writing voltage.

In order to erase data, such a negative voltage that becomes lower than a potential of the island-like semiconductor region 210 is applied to the control gate electrode (217). Accordingly, a high electric field is generated indirectly between the floating gate electrode (216) and the island-like semiconductor region 210, whereby F-N tunneling current is generated therebetween, and electrons are released to the island-like semiconductor region 210 from the floating gate electrode (216). Accordingly, the threshold voltage of the memory element 100 is in a low state again, and data "0" is stored in the memory cell 40. In other words, the memory cell 40 is in an erasing state. The potential difference between the high voltage of positive polarity and the high voltage of negative polarity, which is for performing an erasing operation, is an erasing voltage. A high voltage of positive polarity is applied to the source line SL0 and the bit line BL0, and a high voltage of negative polarity is applied to the word line WL1, whereby electrons can be extracted from the floating gate electrode of the memory element 100 to the island-like semiconductor region 210.

For example, data can be read in the following manner. With the potentials of the source line SL0 and the bit line BL0 set at approximately 0 V and 1.5 V, respectively, a reading voltage is applied to the word line WL1. This reading voltage can be an intermediate value of the threshold voltages which corresponds to data "0" and data "1" of the memory element 100. Whether current flows through the bit line BL0 or not when a reading voltage is applied to the word line WL1 corresponds to whether data is "1" or "0". Whether current flows through the bit line BL0 or not is determined by the sense amplifier 25, and this determination result is outputted as data (DATA) from the nonvolatile semiconductor memory device 10.

In a nonvolatile memory element provided with a floating gate electrode like the memory element 100, a rewriting operation (writing and erasing) of data is performed by formation of a high electric field and transfer of electric charges between the floating gate electrode and the island-like semiconductor region. Therefore, a rewriting operation is not a nondestructive operation for a nonvolatile memory element but involves deterioration of an interface of the insulating film which exists between the island-like semiconductor region and the floating gate electrode, and the inner portion of the insulating film. More specifically, increase in an interface state between the island-like semiconductor region and the insulating film, generation of a trap level in the insulating film, or the like occurs by rewriting. Therefore, there is limitation on the number of times a nonvolatile memory element can be rewritten. The deterioration of a nonvolatile memory element due to the rewriting operation appears as decrease in mutual conductance (gm) which represents on characteristics, for example. When mutual conductance decreases, influence arises in decrease of the current drive capability of a nonvolatile memory element, difficulty in distinguishing a writing state and an erasing state of a nonvolatile memory element, and the like.

Figure 14A:
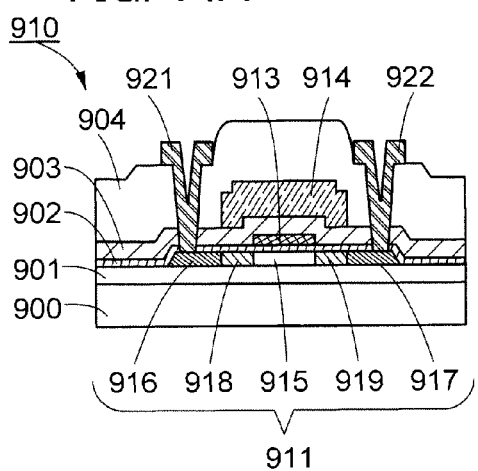
FIGS. 14A and 14B are, respectively, a cross-sectional view (channel length direction) and a cross-sectional view (channel width direction), which illustrate an example of a structure of a nonvolatile memory element of Patent Document 3.
Figure 14B:
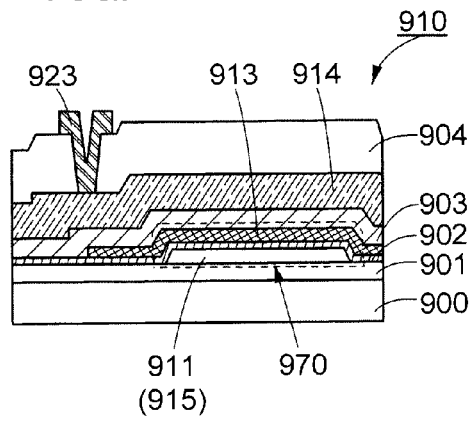
Figure 16A:
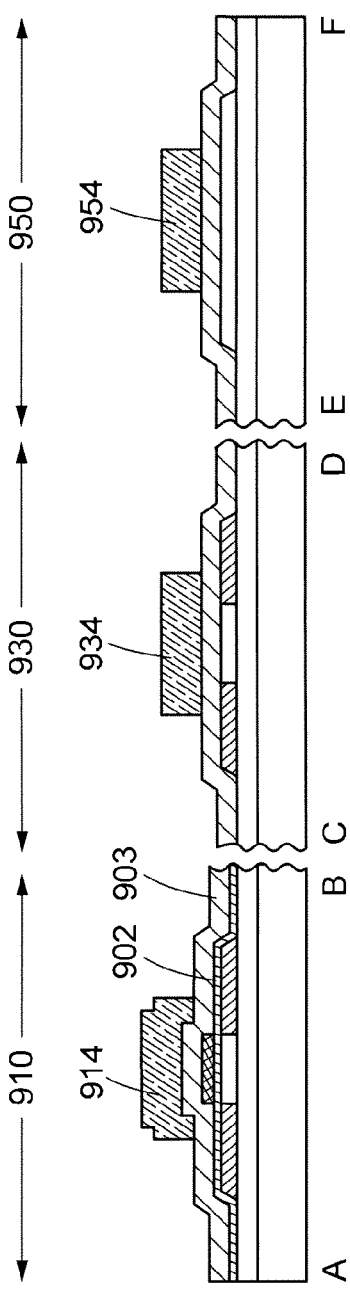
FIGS. 16A and 16B are cross-sectional views (channel length direction) illustrating steps subsequent to FIG. 15C.
Figure 16B:
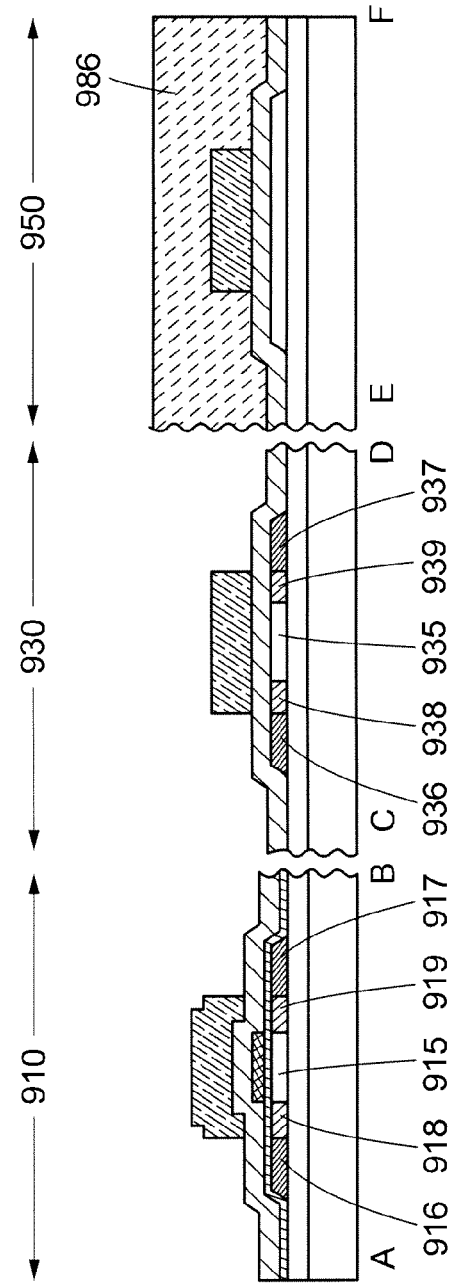
Figure 17A:
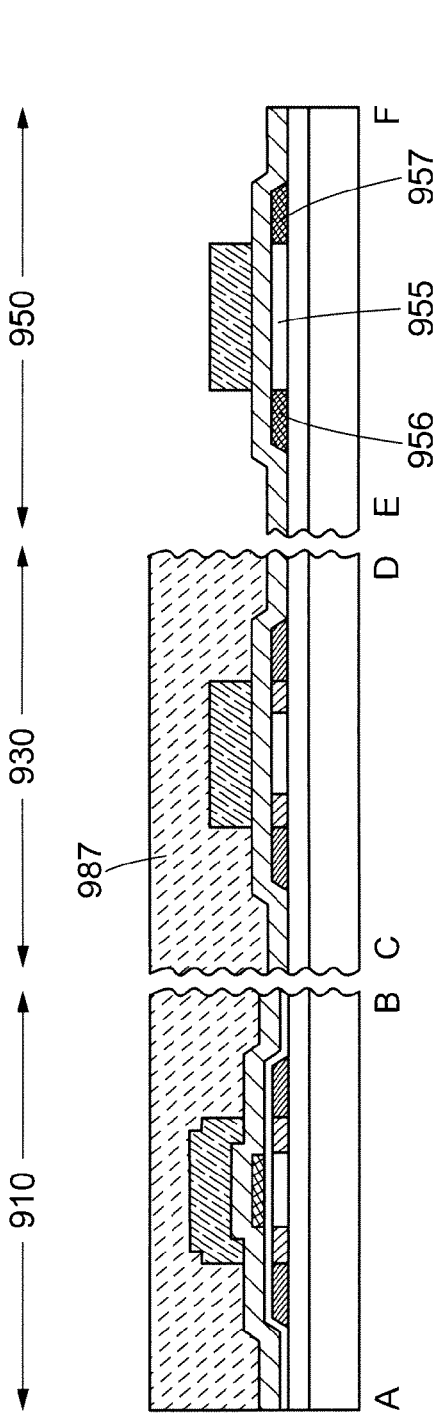
FIGS. 17A and 17B are cross-sectional views (channel length direction) illustrating steps subsequent to FIG. 16B.
Figure 17B:
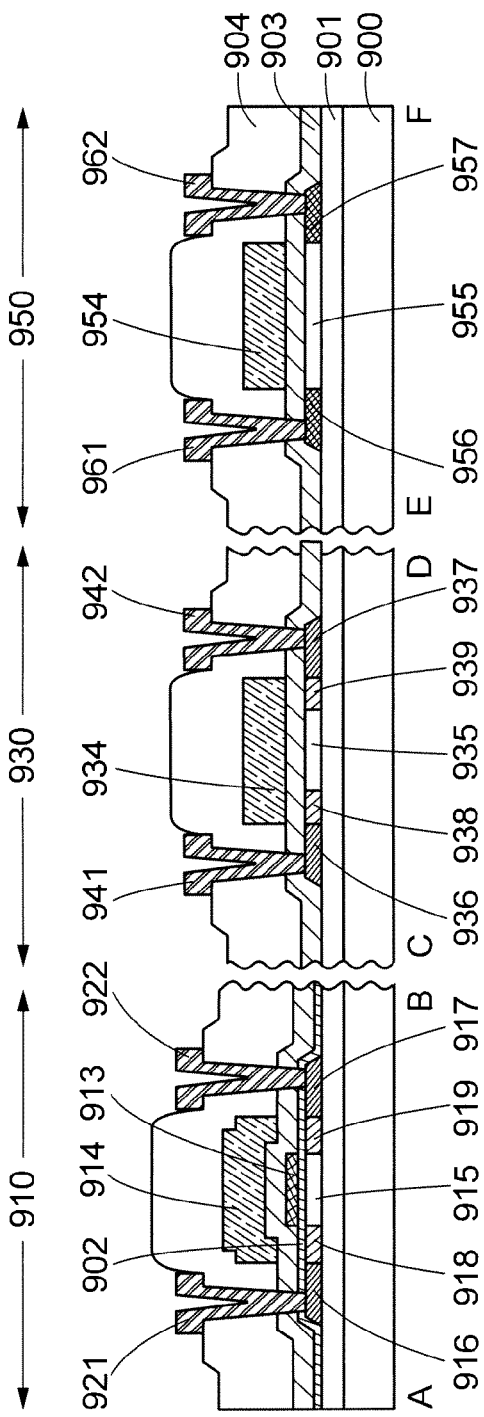

The memory element 100 (see FIGS. 1A and 1B) and the memory element 910 (see FIGS. 14A and 14B) are compared in mutual conductance below to describe that deterioration in mutual conductance due to rewriting of a nonvolatile memory element provided with a floating gate electrode can be suppressed according to this embodiment.

As shown in Formula (1), when a region 970 (a region surrounded with a dotted line in FIG. 14B) of the memory element 910 has mutual conductance of $gm_{91}$, the entire mutual conductance $gm_{9tot}$ of the memory element 910 is equivalent to $gm_{91}$.

[Formula 1]

$$gm_{9tot} = gm_{91} \quad (1)$$

On the other hand, in the memory element 100, the thickness of the insulating film interposed between the floating gate electrode (216) and the island-like semiconductor region 210 differs at the end portion of the island-like semiconductor region 210 and at the other portions (the central portion of the island-like semiconductor region 210); therefore, the entire mutual conductance $gm_{1tot}$ of the memory element 100 is expressed in the following Formula (2). In Formula (2), $gm_{11}$, $gm_{12}$, and $gm_{13}$ denote mutual conductance of a region 301, a region 302, and a region 303 in FIG. 1B, respectively.

[Formula 2]

$$gm_{1tot} = gm_{12} + (gm_{11} + gm_{13}) \quad (2)$$

The amount of electric charge of F-N tunneling current which is generated by writing and erasing depends on the film thickness of a tunnel insulating film of a nonvolatile memory element. F-N tunneling current is easily generated due to quantum effect as the film thickness becomes smaller, whereas hardly generated as the film thickness becomes larger. Therefore, in a region serving as a path where electric charges are injected or extracted to or from the floating gate electrode with a writing operation or an erasing operation, the insulating film between the island-like semiconductor region and the floating gate electrode is formed thin so that the electric charge can be passed therethrough. Needless to say, the insulating film which exists in this region needs to be thick enough so that the electric charge does not leak from the floating gate electrode in order to hold data in the nonvolatile memory element.

In the memory element 910, a portion included in the region 970 of the insulating film 902 functions as a tunnel insulating film. On the other hand, in the memory element 100, both the insulating film 202 and the insulating film 203 exist between the floating gate electrode (216) and the island-like semiconductor region 210. In the regions 301 and 302 where the thick insulating film is formed with the stack of the insulating films 202 and 203, F-N tunneling current can be made to generate hardly even when a high electric field is applied, and, in the region 302 where a thin insulating film is formed with only the insulating film 203, F-N tunneling current is generated by a high electric field, so that the insulating film 203 can be made to function as a tunnel insulating film. In other words, by adjustment of the insulating film 202 in thickness, the regions 301 and 303 can be a region which is not involved in injection and extraction of electric charge into and from the floating gate electrode without influence on injection and extraction of electric charge into and from the floating gate electrode in the region 302.

As described above, since F-N tunneling current is generated by a high electric field with a rewriting operation, an interface between the island-like semiconductor region and the tunnel insulating film and the tunnel insulating film itself deteriorate; therefore, decrease in mutual conductance, the amount of F-N tunneling current, or the like occurs in a region where F-N tunneling current is generated. Therefore, such deterioration occurs in the entire region 970 in the memory element 910; thus, when rewriting is performed, the mutual conductance $gm_{91}$ of the region 970 is decreased. Accordingly, as shown in Formula (3), when rewriting is repeated, the mutual conductance $gm_{9tot}$ of the memory element 910 is decreased up to a lower limit of the mutual conductance and thus it is difficult to determine whether the memory element 910 is in a writing state or in an erasing state. That is, data stored in the memory element 910 cannot be read any more.

[Formula 3]

$$0 \leq gm_{9tot} \leq gm_{91} \tag{3}$$

On the other hand, in the memory element 100, the mutual conductance $gm_{1tot}$ can be maintained at a value larger than the minimum value which is accepted in the memory element 100 without limitation on the number of rewriting. The reason is as follows.

As illustrated in FIG. 1B, the region 302 is a region where the opening 218 is formed in the insulating film 202, and the regions 301 and 303 are regions where the opening 218 is not formed. Since F-N tunneling current is generated in the region 302 by application of a high electric field through a rewriting operation, an interface between the insulating film 203 and the island-like semiconductor region 210 and the insulating film 203 itself deteriorate in a manner similar to that of the region 970 of the memory element 910. Therefore, as well as the mutual conductance $gm_{91}$ of the region 970, the mutual conductance $gm_{12}$ of the region 302 is decreased with rewriting of the memory element 100. On the other hand, since the insulating films 202 and 203 are stacked between the island-like semiconductor region 210 and the floating gate electrode (216) in the regions 301 and 303, the insulating film thicker than the region 302 exists. Therefore, an electric field applied to the stacked film of the insulating films 202 and 203 becomes weaker and thus it is possible to make fewer generation of F-N tunneling current. Accordingly, the respective values of the mutual conductance $gm_{11}$ and $gm_{13}$ of the regions 301 and 303 are maintained with little decrease even when a rewriting operation is repeated, without depending on characteristics of a dielectric strength voltage or the like of the insulating films 202 and 203.

As shown in the above Formula (2), the entire mutual conductance $gm_{1tot}$ of the memory element 100 is a sum of the mutual conductance $gm_{12}$ (decreases with a rewriting operation) of the region 302 and the mutual conductance $gm_{11}$ and $gm_{13}$ (hardly deteriorates with a rewriting operation) of the regions 301 and 303. Therefore, the relation of the entire mutual conductance $gm_{1tot}$ and the mutual conductance of each region, $gm_{11}$, $gm_{12}$, and $gm_{13}$, of the memory element 100 can be expressed as in Formula (4). Formula (4) shows that, as the value of the mutual conductance $gm_{1tot}$, ($gm_{11}$+$gm_{13}$) or more is maintained even when a rewriting operation is performed.

[Formula 4]

$$(gm_{11}+gm_{13}) \leq gm_{1tot} \leq gm_{12}+(gm_{11}+gm_{13}) \tag{4}$$

Therefore, according to this embodiment, the memory element 100 excellent in resistance to rewriting can be obtained. More specifically, according to this embodiment, advantageous effects such as prevention of error at reading of the memory element 100 and maintenance of the current drive capability of the memory element 100 can be obtained even when a rewriting operation is repeated.

In addition, according to this embodiment, the nonvolatile semiconductor memory device 10 in which the memory element 100 excellent in resistance to rewriting as described above and the transistor 101 and/or the transistor 102 which are/is suitable for a high withstand voltage transistor are provided over one substrate 200 can be obtained.

In the nonvolatile semiconductor memory device 10 of this embodiment, for the substrate 200, a substrate such as a substrate made from an insulating material, a semiconductor substrate, a stainless steel substrate, or a metal substrate can be used.

A substrate such as a glass substrate, a quartz substrate, a sapphire substrate, a ceramic substrate, a resin substrate, a resin film, or a sheet in which fabric of carbon fiber or glass fiber is combined with a resin (for example, a prepreg) can be used as the substrate made from an insulating material. A non-alkali glass substrate is preferably used as the glass substrate applied to the substrate 200. As a non-alkali glass substrate, for example, an aluminosilicate glass substrate, an aluminoborosilicate glass substrate, or a barium borosilicate glass substrate can be used.

A silicon wafer obtained by slicing an ingot, a semiconductor substrate having an SOI structure, in which a semiconductor layer is formed over a substrate with an insulating layer interposed therebetween, or the like can be used as a semiconductor substrate. As a substrate of the semiconductor substrate having an SOI structure, a substrate made from an insulating material such as a glass substrate or a quartz substrate, or a substrate made from an alloy, such as a stainless steel substrate, can be applied in addition to a bulk semiconductor substrate like a silicon wafer. As the glass substrate of this case, a non-alkali glass substrate is preferably used. As a non-alkali glass substrate, for example, an aluminosilicate glass substrate, an aluminoborosilicate glass substrate, a barium borosilicate glass substrate, or the like can be used.

The insulating films 201 to 205 each may have a single-layer structure or a stacked structure. An insulating film containing silicon or germanium as its component, such as a silicon oxide film, a silicon nitride film, a silicon oxynitride film, a silicon nitride oxide film, a germanium oxide film, a germanium nitride film, a germanium oxynitride film, or a germanium nitride oxide film, can be used as each of the insulating films 201 to 205. Alternatively, an insulating film including metal oxide, such as aluminum oxide, tantalum oxide, or hafnium oxide; an insulating film including metal nitride, such as aluminum nitride; an insulating film including metal oxynitride, such as an aluminum oxynitride film; or an insulating film including metal nitride oxide, such as an aluminum nitride oxide film, can be used. Further alternatively, an insulating film containing an organic compound can be used. Examples of such an organic compound are acrylic, polyimide, polyamide, polyimide amide, benzocyclobutene, and the like. Note that in this specification, oxidized nitride is a substance in which the oxygen content is larger than the nitrogen content and nitride oxide is a substance in which the nitrogen content is larger than the oxygen content.

A typical method for forming such insulating films are as follows: a chemical vapor deposition (CVD) method such as a plasma-enhanced CVD (PECVD) method or a thermal CVD method; a physical vapor deposition (PVD) method such as a sputtering method or an evaporation method; atomic layer deposition (ALD) method; a method for forming a film using a liquid material or a pasty material, such as a spin coating method, a droplet discharge method, or a dip coating method; solid-phase oxidation using plasma, heat, or the like; solid-phase nitriding using plasma, heat, or the like; and the like.

The island-like semiconductor regions 210, 230, and 250 are each formed using a semiconductor film in a single-layer structure or a stacked structure having a thickness of approximately 10 nm to 1 μm. The crystallinity of the semiconductor films which form the island-like semiconductor regions 210, 230, and 250 may be either a single crystal structure or a non-single-crystal structure. As a non-single-crystal semiconductor film, there are a non-single-crystal semiconductor film, a microcrystalline semiconductor film, a polycrystalline semiconductor film, and the like. In addition, a semiconductor film containing an element belonging to Group 14, such as a silicon film, a germanium film, a silicon germanium film, or a silicon carbide film, can be applied to these semiconductor films. Alternatively, a compound semiconductor film such as a GaAs film, an InP film, or a GaN film; or an oxide semiconductor film containing indium oxide, zinc oxide, or the like can be applied. These semiconductor films can be formed by a CVD method such as a PECVD method or a thermal CVD method; a PVD method such as a sputtering method or an evaporation method; an ALD method; or a method for forming a film using a liquid material or a pasty material, such as a spin coating method, a droplet discharge method, or a dip coating method. Alternatively, the island-like semiconductor regions 210, 230, and 250 can each be formed with a semiconductor layer which is formed by thinning a semiconductor substrate such as a single crystal silicon substrate.

In addition, the conductive films (216, 217, 221, and the like) included in the nonvolatile semiconductor memory device 10 each may have a single-layer structure or a stacked structure. For example, a film containing a simple metal selected from tantalum, tungsten, titanium, molybdenum, aluminum, chromium, niobium, gold, silver, copper, platinum, or the like as its main component; an alloy film containing the above metal as its main component; a metal compound film of the above metal; or the like can be used as a film which forms each of the conductive films. Alternatively, a semiconductor film of silicon, germanium, silicon germanium, or the like, where a donor or an acceptor is included, can be used. For example, as the alloy film, an aluminum-copper alloy film, an aluminum-neodymium alloy film, or the like can be used. As the metal compound film, a metal nitride film such as a titanium nitride film or a tungsten nitride film, or a silicide film such as a nickel silicide film or a cobalt silicide film can be used. Such conductive films can be formed by a PVD method such as a sputtering method or an evaporation method; a method for forming a film using a liquid material or a pasty material, such as a printing method, a droplet discharge method, or a dip coating method; soldering; a plating method; or the like.

For example, each of the conductive films (216, 236, and 256) can be formed in such a manner that a conductive film formed over the insulating film 203 is patterned into a predetermined shape by a photolithography step and an etching step. In this case, the conductive film which forms the conductive films (216, 236, and 256) is the same. In addition, in a manner similar to that of the conductive films (216, 236, and 256), the conductive films (217, 237, and 257) can also be formed from the common conductive film formed over the insulating film 204, and the conductive films (221 to 223, 241 to 243, and 261 to 263) can also be foamed from the common conductive film formed over the insulating film 205.

Note that although the memory element 100 is an n-channel memory transistor in this embodiment, a p-channel memory transistor can also be used. In addition, although the transistor 101 is an n-channel transistor, a p-channel transistor can be used as the transistor 101, and although the transistor 102 is a p-channel transistor, an n-channel transistor can be used as the transistor 102. Moreover, both the transistor 101 and the transistor 102 can be n-channel transistors or p-channel transistors.

Note that this embodiment can be combined with any of the other embodiments as appropriate.

Embodiment 2

In this embodiment, an example of a method for manufacturing the nonvolatile semiconductor memory device 10 of FIG. 3 will be described. Here, as an example of a method for manufacturing the nonvolatile semiconductor memory device 10, a method for manufacturing, at the same time, the memory element 100 and the transistors 101 and 102 which are included in the nonvolatile semiconductor memory device 10 over the same substrate 200 will be described with reference to FIGS. 1A and 1B, FIGS. 2A to 2C, FIGS. 5A to 5D, FIGS. 6A to 6C, FIGS. 7A to 7C, and FIGS. 8A to 8D. Note that FIGS. 5A to 5D, FIGS. 6A to 6C, and FIGS. 7A to 7C are each a cross-sectional view taken along the same line as FIG. 1A, which describe a cross-sectional structure in a channel length direction of each of the semiconductor elements (100 to 102) in a manufacturing process. In addition, FIGS. 8A to 8D are each a cross-sectional view taken along the same line as FIG. 1B, which describe a cross-sectional structure in a channel width direction of each of the semiconductor elements (100 to 102) in a manufacturing process.

As illustrated in FIGS. 1A and 1B, the transistors 101 and 102 have a similar stacked structure to the memory element 100 provided with the floating gate electrode. The structural difference between the memory element 100 and the transistors 101 and 102 is electric characteristics which are required for each semiconductor element. Specifically, in the transistors (101 and 102), the conductive films (236 and 256) are not in an electrically floating state but electrically connected to the conductive films (237 and 257) and are each made to function as a gate electrode. In addition, there are structural differences in that each channel length of the transistors 101 and 102 are made longer than the channel length of the memory element 100 so that the transistors 101 and 102 have a structure appropriate for a high withstand voltage transistor and in that the insulating films 202 and 203 are stacked between the conductive films (236 and 256) and the island-like semiconductor regions (230 and 250) so that the region having a small film thickness is not formed in the gate insulating film, for example.

There are such structural differences between the memory element 100 and the transistors 101 and 102; however, the stacked structures thereof are similar, and the transistors 101 and 102 can be manufactured using the same films as the films which form the memory element 100, such as the insulating films, the conductive films, and the semiconductor film. That is, the transistors 101 and 102 can be almost manufactured in the manufacturing process of the memory element 100 without complicating the manufacturing process. An example of a method for manufacturing the memory element 100 and the transistors 101 and 102 over one substrate 200 is described below.

First, as illustrated in FIG. 5A, the insulating film 201 having a single layer or a plurality of layers is formed on the top surface of the substrate 200. It is possible to obtain such advantageous effects that the provision of the insulating film 201 on the top surface of the substrate 200 can reduce the influence of the roughness of the top surface of the substrate 200 and prevention of impurities in the substrate 200 from diffusing into each semiconductor element (100 to 102). In the case where the insulating film 201 includes a plurality of layers, a film may be selected as appropriate from the films that can be applied to the insulating film 201, which are described in Embodiment 1, depending on the purpose such as prevention of impurity contamination, or compatibility with the adjacent film. Moreover, the insulating film 201 is not necessarily formed if there is no necessity as in the case of using a quartz substrate as the substrate 200.

Next, the island-like semiconductor regions 210, 230, and 250 are formed over the insulating film 201. As an example of a method for forming the island-like semiconductor regions 210, 230, and 250, a method for forming these regions with a polycrystalline semiconductor film is described. A polycrystalline semiconductor film can be formed by crystallization of an amorphous semiconductor film. Note that as a crystallization method of an amorphous semiconductor film, a laser irradiation method, a thermal crystallization method using an RTA apparatus or a diffusion furnace, a crystallization method using metal elements which promote crystallization, a combination thereof, or the like can be employed. In this embodiment, the island-like semiconductor regions 210, 230, and 250 are formed in such a manner that an amorphous silicon film having a thickness of 60 nm is irradiated with a second harmonic (wavelength: 532 nm) of a semiconductor laser (LD) pumped continuous wave (CW) laser ($YVO_4$), so that a polycrystalline silicon film is formed, and this polycrystalline silicon film is processed into a shape as illustrated in FIGS. 2A to 2C by a photolithography step and an etching step.

In addition, there are following methods to form the island-like semiconductor regions 210, 230, and 250 with a single crystal semiconductor layer. A single crystal semiconductor layer is formed by attachment of a single crystal semiconductor substrate to the substrate 200 with the insulating film 201 interposed therebetween and thinning of the single crystal semiconductor substrate by a Smart Cut (registered trademark) method or the like, and this single crystal semiconductor layer may be processed into a desired shape by a photolithography step and an etching step. In addition, the island-like semiconductor regions 210, 230, and 250 including a single crystal semiconductor layer can be formed using a single crystal semiconductor substrate having an SOI structure manufactured by a SIMOX method or the like. In this case, a buried oxide layer corresponds to the insulating film 201, and the single crystal semiconductor substrate corresponds to the substrate 200.

Next, the insulating film 202 having a single layer or a plurality of layers is formed so as to cover the island-like semiconductor regions 210, 230 and 250. The thickness of the insulating film 202 can be 1 nm to 100 nm inclusive. For example, a 20 nm thick silicon oxide film can be formed as the insulating film 202 by a PECVD method.

Figure 8A:
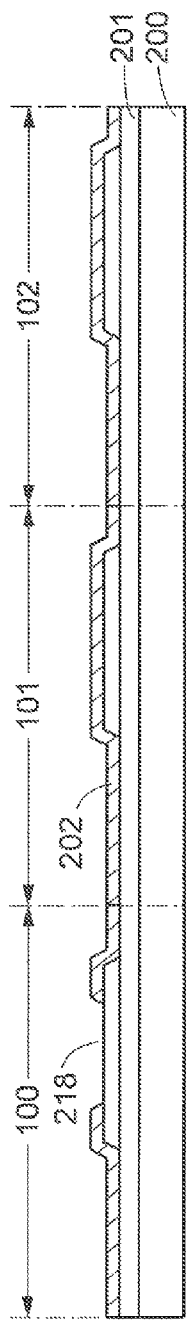
FIGS. 8A, 8B, 8C, and 8D are, respectively, a cross-sectional view illustrating the same step as FIG. 5B, the cross-sectional view illustrating the same step as FIG. 5D, the cross-sectional view illustrating the same step as FIG. 6C, and the cross-sectional view illustrating the same step as FIG. 7C, which are in a channel width direction of a nonvolatile semiconductor memory device.

Next, as illustrated in FIG. 5B and FIG. 8A, openings 218, 238, 239, 258, and 259 are formed in the insulating film 202. Each opening can be formed in such a manner that a resist mask is formed over the insulating film 202 by a photolithography step and the insulating film 202 is etched using the resist mask. The opening 218 is formed in order to form the thin film region of the insulating film 203 in the first gate insulating film of the memory element 100. In this embodiment, the opening 218 also includes a portion where the contact holes 225 and 226 are formed. On the other hand, the opening 238 and the opening 239 formed over the island-like semiconductor region 230 include a portion where the contact hole 245 is formed and a portion where the contact hole 246 is formed, respectively; and the opening 258 and 259 formed over the island-like semiconductor region 250 include a portion where the contact hole 265 is formed and a portion where the contact hole 266 is formed, respectively. Note that the openings 238, 239, 258, and 259 are formed so that the insulating film 202 exists over the end portions (step portion) of the island-like semiconductor regions 230 and 250.

The openings 218, 238, 239, 258, and 259 are formed in the insulating film 202 in this a manner, whereby, through a step of forming the contact holes 225, 226, 245, 246, 265 and 266, the thickness of the insulating film 202 which is etched can be uniformed in each of the contact holes. Accordingly, etching damage of the island-like semiconductor regions 210, 230, and 250 in the etching step can be reduced. Note that when this etching damage is negligibly small, the openings 238, 239, 258, and 259 are not necessarily formed in the insulating film 202.

Although the openings 218, 238, 239, 258, and 259 are formed so that the end portions of the island-like semiconductor regions 210, 230, and 250 are each covered with the insulating film 202 in this embodiment, the end portions of the island-like semiconductor regions 210, 230, and 250 may be covered with the insulating film 202 as needed. For example, the insulating film 202 can be removed from the region where the memory element 100 is formed instead of forming the opening 218. In this case, the first gate insulating film of the memory element 100 is to be formed with only the insulating film 203.

Next, as illustrated in FIG. 5C, the insulating film 203 is formed over the insulating film 202, and a conductive film 350 having a single-layer structure or a stacked structure is formed over the insulating film 203. The insulating film 203 forms a tunnel insulating film in the memory element 100. In the case where the insulating film 203 is formed with a silicon oxide film or a silicon oxynitride film, the thickness thereof can be 3 nm to 20 nm inclusive, preferably 8 nm to 10 nm inclusive. For example, a 10 nm thick silicon oxynitride film can be formed as the insulating film 203 by a PECVD method using a monosilane (SiH$_4$) gas and a nitrous oxide (N$_2$O) gas as a source gas. In the case of using a parallel plate PECVD apparatus, this silicon oxynitride film can be formed under the following conditions: the mass flow ratio of the source gas is SiH$_4$:N$_2$O=1:800 (sccm); the frequency of a high-frequency power supply, 60 MHz; the power of the high-frequency power supply, 150 W; the film formation temperature (substrate temperature), 400° C.; the pressure in the treatment chamber, 40 Pa; and the electrode interval, 28 mm. Note that in this specification, the mass flow ratio of gases is the ratio of the mass flow rate (sccm) of gases supplied to the treatment chamber.

Plasma oxidation treatment may be performed on the insulating film 203. Plasma oxidation treatment is treatment to perform solid phase oxidation on an object by plasma in such a manner that a gas including oxygen in its composition, such as an oxygen gas, is excited to generate a radical including oxygen, such as an O radical or an OH radical, in plasma. As the plasma oxidation treatment performed on the insulating film 203, it is preferable to utilize high-density plasma which is excited by a high-frequency wave such as a microwave (typical frequency is 2.45 GHz) and whose electron density is 1×10$^{11}$ cm$^{-3}$ to 1×10$^{13}$ cm$^{-3}$ inclusive and whose electron temperature is 0.5 eV to 1.5 eV inclusive. In addition, the plasma oxidation treatment can also be performed before the insulating film 203 is formed. Since the top surface of the island-like semiconductor region 210 which is exposed through the opening 218 can be subjected to solid phase oxidation treatment by the plasma oxidation treatment, an advantageous effect of reducing an interface state between the island-like semiconductor region 210 and the tunnel insulating film (the insulating film 203) can be obtained. Therefore, the plasma oxidation treatment on the insulating film 203 is preferably performed for at least 60 seconds.

In this embodiment, after the openings 218, 238, 239, 258, and 259 are formed, first, plasma oxidation treatment by high-density plasma is performed, next the insulating film 203 including a silicon oxynitride film is formed by a PECVD method under the above conditions, and then plasma oxidation treatment by high-density plasma is performed again. As the source gas of such plasma oxidation treatment, a mixed gas of an O$_2$ gas and an Ar gas can be used. Then, the conductive film 350 is formed over the insulating film 203. In this embodiment, a tungsten film is formed as the conductive film 350 by a sputtering method to a film thickness of 30 nm.

Figure 8B:
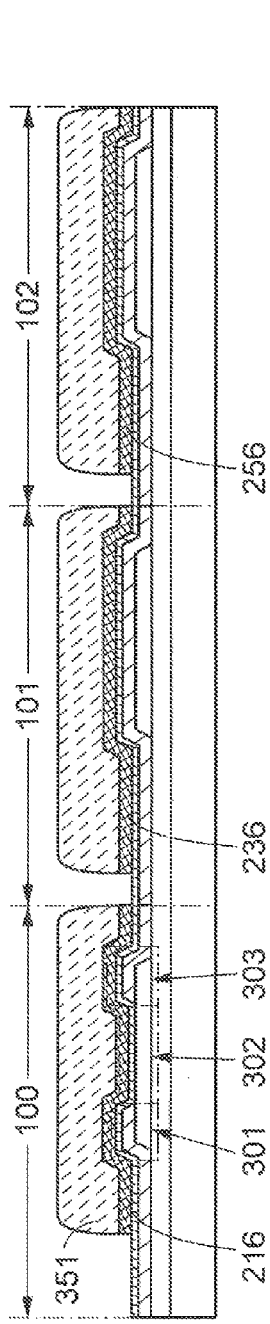

Next, as illustrated in FIG. 5D and FIG. 8B, a resist 351 is formed over the conductive film 350 by a photolithography step. Then, the conductive film 350 is etched using the resist 351 as a mask, so that the conductive films 216, 236, and 256 are formed. The planar shapes of the conductive films 216, 236, and 256 are illustrated in FIGS. 2A to 2C. The length $L_{11}$ (see FIG. 2B) of the conductive film 236 and the length $L_{21}$ (see FIG. 2C) of the conductive film 237 are increased and resistance to the source/drain voltages of the transistors 101 and 102 are increased, whereby the transistors 101 and 102 which are each appropriate for a high withstand voltage transistor can be manufactured.

As described in Embodiment 1, the conductive film 216 forms the floating gate electrode of the memory element 100. As illustrated in FIG. 5D and FIG. 8B, only the insulating film 203 exists in the region 302, and the insulating film 203 is formed with a small film thickness so that F-N tunneling current can be generated. Therefore, in the rewriting operation, electric charge passes through the insulating film 203 by a high electric field, and an interface between the insulating film 203 and the island-like semiconductor region 210 and the insulating film 203 deteriorate; thus, mutual conductance of the region 302 is decreased. Accordingly, in the regions 301 and 303, the insulating films 202 and 203 are stacked and the stacked film is made thick enough so that few F-N tunneling current flows. With such a structure, since mutual conductance of the regions 301 and 303 is maintained even when a rewriting operation is repeated, current driving capability as a memory transistor is maintained in the entire memory element 100 even when a rewriting operation is repeated.

In addition, the insulating films 202 and 203 are stacked between the conductive film 236 and the island-like semiconductor region 230 in the transistor 101 and between the conductive film 256 and the island-like semiconductor region 250 in the transistor 102, whereby the thick gate insulating film can be formed easily. Therefore, the dielectric strength voltage of the gate insulating film of the transistors 101 and 102 can be increased. That is, the structure of the gate insulating film of the transistors 101 and 102 is appropriate for a high withstand voltage transistor.

Next, as illustrated in FIG. 6A, an n-type impurity element is added to the island-like semiconductor regions 210, 230, and 250 using the conductive films 216, 236, and 256 and the resist 351 as masks, so that impurity regions 352 to 357 are formed. In addition, regions where the impurity element is not added in this step of adding an impurity element serve as the channel formation regions 211, 231, and 251, This step of adding an impurity element is a step for forming LDD regions in the memory element 100 and the transistor 101. The impurity regions 352 to 355 become the n-type low concentration regions 214, 215, 234, and 235 illustrated in FIG. 1A. Although the concentration of the n-type impurity element of the impurity regions 352 to 357 depends on the condition of other steps, such as the temperature of heat treatment which activates the impurity element, a concentration of approximately 1.0×10$^{17}$ cm$^{-3}$ to 5.0×10$^{17}$ cm$^{-3}$ is preferable to increase resistance to hot carrier.

Note that in the manufacturing method of this embodiment, addition of the n-type impurity element and the p-type impurity element to the island-like semiconductor regions (210, 230, and 250) can be performed by a doping method, an ion implantation method, or the like. In addition, as the n-type impurity element, phosphorus (P), arsenic (As), or the like can be used; and as the p-type impurity element, boron (B), aluminum (Al), gallium (Ga), or the like can be used. Note that in the step of adding an impurity element, which is illustrated in FIG. 6A, it is preferable to reduce the accelerating voltage of the impurity element as much as possible to suppress the damage on the insulating film 203 included in the memory element 100.

After the resist 351 is removed, the insulating film 204 is formed so as to cover the conductive films 216, 236, and 256 as illustrated in FIG. 6B. A conductive film 360 is formed over the insulating film 204. The thickness of the insulating film 204 can be 10 nm to 100 nm inclusive, preferably 20 nm to 50 nm inclusive. The control gate electrode of the memory element 100 and the gate electrodes of the transistors 101 and 102 are formed from the conductive film 360. In this embodiment, a silicon oxynitride film is formed with a film thickness of 20 nm as the insulating film 204 by a PECVD method. In addition, as the conductive film 360, a 30 nm thick tantalum nitride film is formed and a 150 nm thick tungsten film is formed thereover by a sputtering method.

Figure 8C:
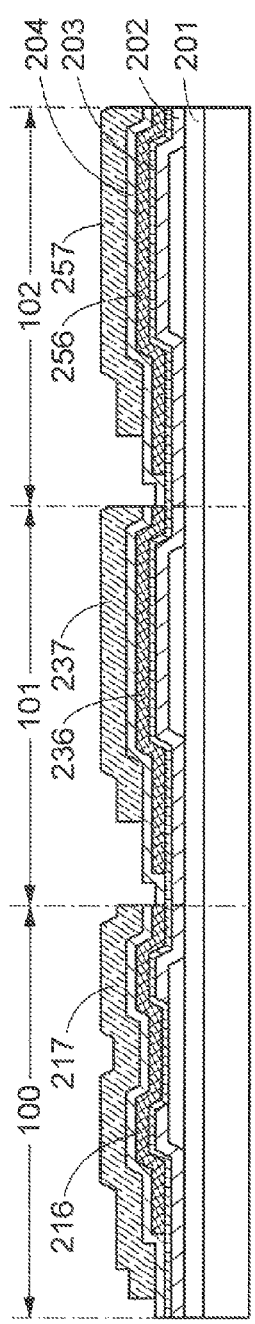

Next, a resist is formed over the conductive film 360 by a photolithography step. The conductive film 360 is etched using the resist as a mask, so that the conductive films 217, 237, and 257 are formed as illustrated in FIG. 6C and FIG. 8C. After the etching step is completed, the resist is removed. The conductive film 217 forms the control gate electrode of the memory element 100, the conductive film 237 forms the gate electrode of the transistor 101, and the conductive film 257 forms the gate electrode of the transistor 102.

In this embodiment, since the conductive film 217 is formed so as to cover the side surfaces of the conductive film 216 in portions 363 and 364 of FIG. 6C, which are surrounded with a short dash line, with the insulating film 204 interposed therebetween, a capacitor is formed between the conductive film 216 and the conductive film 217 in the portions 363 and 364. The capacitor contributes to reduction in rewriting voltage of the memory element 100. Furthermore, the bottom surface of the conductive film 216 which forms the floating gate electrode is covered with the insulating films 202 and 203, and the top and side surfaces thereof are covered with the insulating film 204. Thus, leakage of the electric charge accumulated in the conductive film 216 is suppressed; therefore, the memory element 100 can have excellent charge holding characteristics.

For example, in the case where a glass substrate is applied to the substrate 200, the temperature at which the substrate 200 can be heated is approximately 600° C. or less through the manufacturing process of the nonvolatile semiconductor memory device 10. Therefore, in terms of electric charge holding characteristics of the memory element 100, the number of insulating films which cover the surface of the conductive film 216 serving as the floating gate electrode is preferably reduced so that a simple element structure is obtained. Accordingly, the structure of the memory element 100 of this embodiment is preferable in applying a glass substrate to the substrate 200. In addition, leakage of the electric charge from the floating gate electrode easily occurs at the end portion of the island-like semiconductor region 210; however, provision of the stacked film of the insulating films 202 and 203 at the end portion, which increases the thickness of the insulating film which covers the bottom surface of the floating gate electrode, contributes to improvement in electric charge holding characteristics of the memory element 100.

Next, as illustrated in FIG. 7A, a resist 367 serving as a mask is formed in a region where the memory element 100 and the transistor 101 are formed. Then, a p-type impurity element is added to the island-like semiconductor region 250 using the conductive film 257 as a mask. Here, boron is added as a p-type impurity element. This step of adding an impurity element is performed under such a condition in which conductivity of the n-type impurity regions 356 and 357 formed in the step of adding an n-type impurity element, which is illustrated in FIG. 6A, is converted to p-type. In addition, the step of adding an impurity element is performed under such a condition that the p-type impurity element can pass through the conductive film 256. By this step, the p-type high concentration impurity regions 252 and 253 and the p-type low concentration impurity regions 254 and 255 are formed in a self-aligned manner in the island-like semiconductor region 250.

In this embodiment, a region of the island-like semiconductor region, where the p-type low concentration impurity regions 254 and 255 are formed, is determined by the planar shapes of the conductive films 256 and 257 (see FIG. 2C). In this embodiment, it is preferable to increase resistance to hot carrier of the transistor 102 in such a manner that the conductive films 256 and 257 are formed so as to increase the length $L_{22}$ and thus the length in a channel length direction of the p-type low concentration impurity regions 254 and 255 is increased.

After the resist 367 is removed, a resist 368 serving as a mask is formed in a region where the transistor 102 is formed, as illustrated in FIG. 7B. Then, an n-type impurity element is added to the island-like semiconductor region 210 using the conductive films 216 and 217 as masks, and an n-type impurity element is added to the island-like semiconductor region 230 using the conductive films 236 and 237 as masks. In this embodiment, phosphorus is added as an n-type impurity element. By this step of adding an impurity element, the n-type high concentration impurity regions 212 and 213 and the n-type low concentration impurity regions 214 and 215 are formed in a self-aligned manner in the memory element 100, and the n-type high concentration impurity regions 232 and 233 and the n-type low concentration impurity regions 234 and 235 are formed in a self-aligned manner in the transistor 101.

In this embodiment, a region of the island-like semiconductor region 230, where the n-type low concentration impurity regions 234 and 235 are formed, is determined by the planar shapes of the conductive films 236 and 237 (see FIG. 2B). In this embodiment, it is preferable to increase resistance to hot carrier of the transistor 101 in such a manner that the conductive films 236 and 237 are formed so as to increase the length $L_{12}$ and thus the length in a channel length direction of the n-type low concentration impurity regions 234 and 235 is increased.

The order of the step of adding an impurity element in FIG. 7A and the step of adding an impurity element in FIG. 7B can be reversed. In addition, by changing the impurity element to be added, a p-channel transistor having a structure similar to that of the transistor 101 can be manufactured, and an n-channel transistor having a structure similar to that of the transistor 102 can also be manufactured. Further, the memory element 100 can also be a p-channel memory transistor.

The resist 368 is removed, so that the insulating film 205 is formed as illustrated in FIG. 7C. The insulating film 205 can be formed using a film selected from an inorganic material film such as a silicon oxide film or a silicon nitride film; a film including an organic compound such as epoxy, polyimide, polyimide, polyvinyl phenol, benzocyclobutene, or acrylic; and a film including a siloxane material such as a siloxane resin in a single-layer structure or a stacked structure. The film including an organic compound or the film including a siloxane material can be formed by a coating method; therefore, unevenness due to the semiconductor film or the conductive film can be reduced by application of any of such films to the insulating film 205. Note that since moisture is easily absorbed in and passes through the film including an organic compound or the film including a siloxane material, such a film is formed so as not to be in contact with the film which is likely to be adversely affected by moisture. Therefore, an inorganic material film may be formed between such a film and the film including an organic compound or the film including a siloxane material. As the inorganic material film, an inorganic material film including silicon nitride, silicon nitride oxide, or the like is particularly preferable because of its high blocking effect to moisture. In this embodiment, as the insulating film 205, a film having a three-layer structure in which a 50 nm thick silicon oxynitride film, a 100 nm thick silicon nitride oxide film, and a 600 nm thick silicon oxynitride film are stacked from the lowest layer is formed.

Heat treatment to activate the impurity elements which have been added to the island-like semiconductor regions 210, 230, and 250 is performed as needed. This activation step can be performed before or after the insulating film 205 is formed. In addition, in the case where the insulating film 205 is a stacked film, an activation step can also be performed in a process of forming the stacked film. For example, in the case of this embodiment, heat treatment of approximately 550° C. is performed to activate the impurity elements after the first silicon oxynitride film which forms the insulating film 205 is formed. Then, the second silicon nitride oxide film and the third silicon oxynitride film are formed.

Figure 8D:
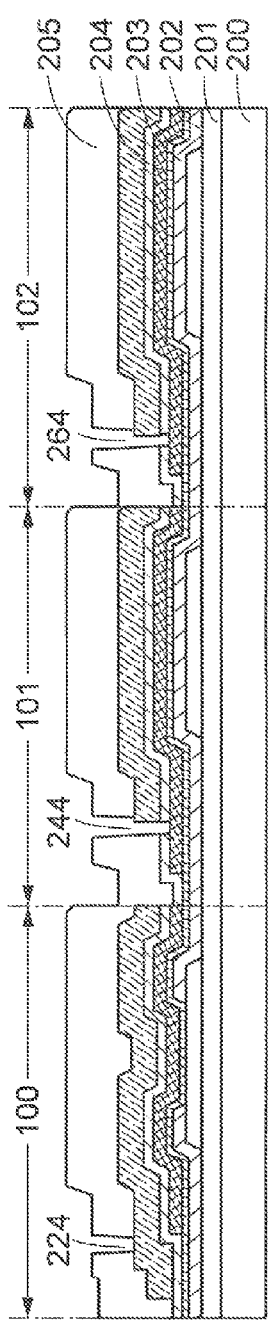

Next, a resist serving as a mask is formed over the insulating film 205 by a photolithography step. The insulating films 203 to 205 are etched using this resist, so that the contact holes 224 to 226, the contact holes 244 to 246, and the contact holes 264 to 266 are formed as illustrated in FIG. 7C and FIG. 8D.

Next, after the resist is removed, a conductive film is formed over the insulating film 205. For example, a conductive film having a four-layer structure in which a titanium film, a titanium nitride film, an aluminum film, and a titanium film are sequentially stacked is formed over the insulating film 205 by a sputtering method. The conductive film is processed into a predetermined shape by a photolithography step and an etching step, so that the conductive films 221 to 223 are formed in the memory element 100; the conductive films 241 to 243 are formed in the transistor 101; and the conductive films 261 to 263 are formed in the transistor 102, as illustrated in FIGS. 1A and 113. As illustrated in FIG. 1B, the conductive films 236 and 237 are electrically connected to each other through the conductive film 241, and function as the gate electrodes of the transistor 101; and the conductive films 256 and 257 are electrically connected to each other through the conductive film 261, and function as the gate electrodes of the transistor 102.

Through the above-described steps, the nonvolatile semiconductor memory device 10 illustrated in FIGS. 1A and 1B is manufactured. The structures of the transistors 101 and 102 of this embodiment is an example, and it is needless to say that various known techniques can be applied, so that the structures can be changed. For example, in the island-like semiconductor region 230 and/or the island-like semiconductor region 250, two or more LDD regions or two or more channel formation regions can be formed. Further, a sidewall may be formed on a side surface of the conductive film 237 and/or the conductive film 257.

Note that this embodiment can be combined with any of the other embodiments as appropriate.

Embodiment 3

Figure 9A:
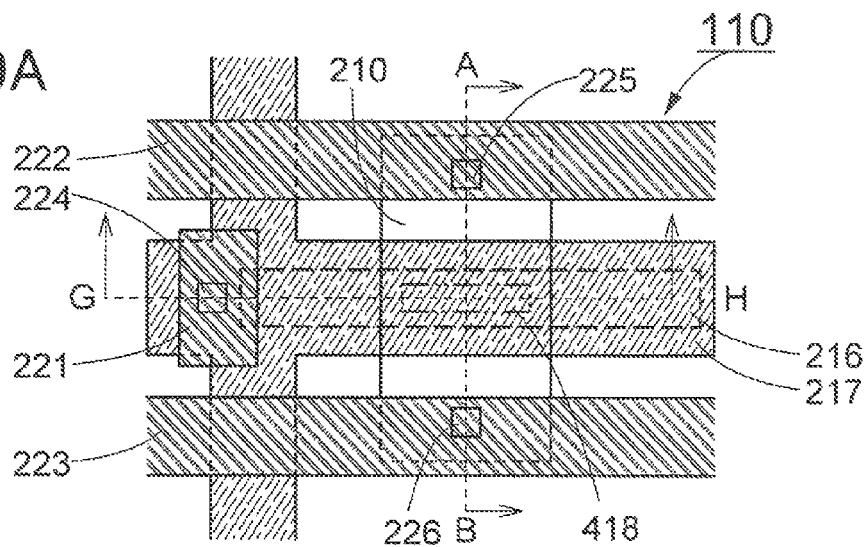
FIGS. 9A, 9B, and 9C are, respectively, a plan view illustrating an example of a structure of a nonvolatile memory element included in a nonvolatile semiconductor memory device according to one embodiment of the present invention, a cross-sectional view taken along line A-B of FIG. 9A, and a cross-sectional view taken along line G-H of FIG. 9A.
Figure 9B:
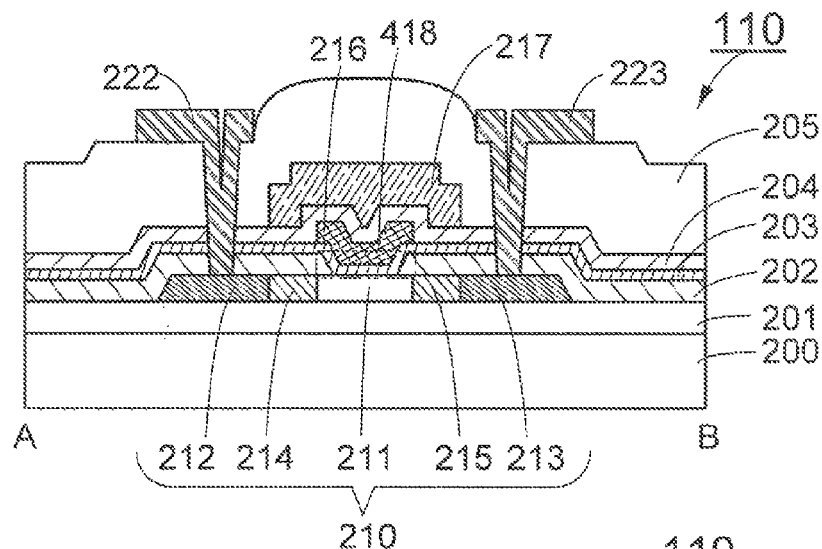
Figure 9C:
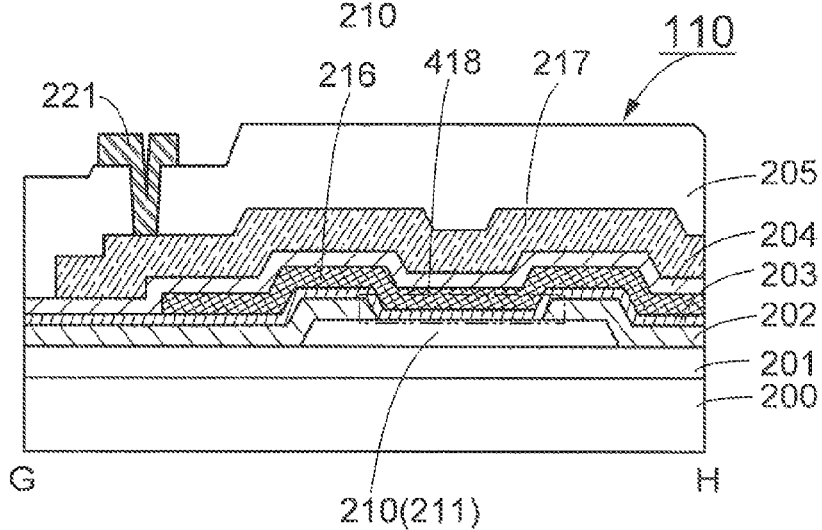

In this embodiment, the structure of a nonvolatile memory element which is different from the structure of the memory element 100 of Embodiment I will be described. FIG. 9A is a plan view of a nonvolatile memory element 110 of this embodiment. A cross-sectional view taken along line A-B of FIG. 9A is illustrated in FIG. 9B, and a cross-sectional view taken along line G-H of FIG. 9A is illustrated in FIG. 9C. In other words, FIG. 9B is a cross-sectional view taken along a channel length direction (a direction perpendicular to a gate) of the nonvolatile memory element 110, whereas FIG. 9C is a cross-sectional view taken along a channel width direction (a direction horizontal to the gate) of the nonvolatile memory element 110.

Here, a difference of the structure of the nonvolatile memory element 110 (hereinafter referred to as the "memory element 110") from that of the memory element 100 is described with reference to FIGS. 9A to 9C. As illustrated in FIG. 9A, an opening 418 formed in the insulating film 202 is different from the opening 218 of the memory element 100. In a manner similar to that of the opening 218, the opening 418 is formed in the insulating film 202 in such a manner that the insulating films 202 and 203 are stacked in a portion where the conductive film 216 is formed over the end portion (a step portion) of the island-like semiconductor region 210 and a region where only the insulating film 203 exists is formed between the channel formation region 211 and the conductive film 216. Note that in the memory element 110, the region where the insulating films 202 and 203 are stacked on the top surface of the island-like semiconductor region 210 (the thick film region) is wider and the region where only the insulating film 203 exists (the thin film region) is narrower than those of the memory element 100. In the memory element 110, not only the end portion of the island-like semiconductor region 210 but also the surfaces of the n-type high concentration impurity regions 212 and 213 and the n-type low concentration impurity regions 214 and 215 are covered with the insulating film 202. On the other hand, in the memory element 100, there are portions where the insulating film 202 does not exist over these regions (see FIG. 1A and FIG. 2A).

In other words, the opening 218 is formed in a region of the insulating film 202, where the island-like semiconductor region 210 overlaps at least with the conductive film 217, whereas the opening 418 is formed by removal of a region of the insulating film 202, where the conductive film 216 and the conductive film 217 overlap with each other. Needless to say, both the opening 218 and the opening 418 are formed so that a portion of the insulating film 202, which covers the end portion of the island-like semiconductor region 210, remains.

In the memory element 110, as illustrated in FIG. 9B, the tunnel insulating film of the insulating film 203 exists only between the conductive film 216 and the channel formation region 211 in the channel length direction, and the insulating films 202 and 203 are stacked over the n-type high concentration impurity regions 212 and 213. Thus, also in the memory element 110, the value of mutual conductance can be maintained to the predetermined value or more even when a rewriting operation is performed, in a manner similar to that of the memory element 100. Therefore, in a manner similar to that of the memory element 100, it is possible to obtain such advantageous effects that error in reading the memory element 110 is prevented and the current driving capability of the memory element 110 is maintained.

In addition, the memory element 110 is different from the memory element 100 only in the opening 418, and the memory element 110 and the transistors 101 and 102 can be manufactured over one substrate 200 according to the manufacturing method of Embodiment 2. The length $L_{11}$ of the conductive film 216 cannot be reduced more than the size of the opening 418 in the memory element 110. Accordingly, although there is a disadvantage that the conductive film 216 cannot be reduced to a minimum size which is determined by the photolithography step, there is an advantage that the conductive film 216 is formed easier than the memory element 100. This is because, in the memory element 110, the end portion of the conductive film 216 exists over the thick insulating film in which the insulating films 202 and 203 are stacked. In contrast, in the memory element 100, the end portion of the conductive film 216 exists over the thin insulating film partly including only the insulating film 203. As a nonvolatile memory element of a nonvolatile semiconductor memory device, whether the memory element 100 or the memory element 110 is applied may be determined in consideration of a specification of the nonvolatile semiconductor memory device, the performance of a manufacturing apparatus which is used for the manufacturing, and the like.

Note that this embodiment can be combined with any of the other embodiments as appropriate.

Embodiment 4

In the manufacturing method of Embodiment 2, the substrate 200 which has been used during the manufacturing of the nonvolatile semiconductor memory device 10 is used without any change as the substrate of the nonvolatile semiconductor memory device 10. After the integrated circuit which forms the nonvolatile semiconductor memory device 10 is manufactured, the integrated circuit is separated from the substrate which has been used for the manufacturing, so that the integrated circuit can be fixed onto another substrate. In this embodiment, a method for manufacturing a nonvolatile semiconductor memory device in this manner will be described.

For example, in the manufacturing of Embodiment 2, a separation layer (for example, a film including silicon) is formed between the substrate 200 and the insulating film 201 serving as a base and is removed by etching, so that the integrated circuit can be separated from the substrate 200. Further, the integrated circuit which forms the nonvolatile semiconductor memory device can be separated from the substrate 200 also by application of physical force to the separation layer and generation of separation at the separation layer. An example of a method for separating the substrate which has been used during the manufacturing from the integrated circuit which forms the nonvolatile semiconductor memory device by application of physical force and fixing the integrated circuit onto another substrate is described below with reference to FIGS. 10A to 10E and FIGS. 11A and 11B.

Figure 10A:
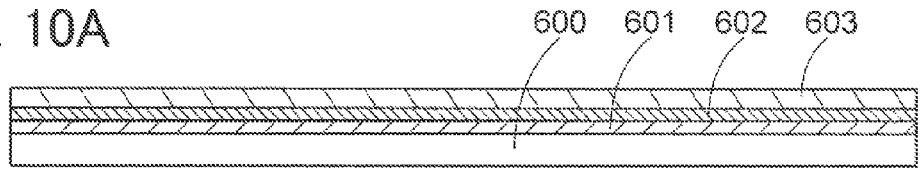
FIGS. 10A to 10E are cross-sectional views illustrating an example of a method for manufacturing a nonvolatile semiconductor memory device according to one embodiment of the present invention.

First, as illustrated in FIG. 10A, a 100 nm thick silicon oxynitride film 601 is formed over a glass substrate 600 by a PECVD method, and a 30 nm thick tungsten film 602 is formed over the silicon oxynitride film 601 by a sputtering method. The tungsten film 602 serves as a separation layer. The tungsten film 602 is formed in order to generate separation easily between the base insulating film (the insulating film 201) of the integrated circuit and the glass substrate 600 by application of force. As well as the tungsten film, the separation layer can be formed using a metal film selected from molybdenum, titanium, tantalum, niobium, nickel, cobalt, zirconium, zinc, ruthenium, rhodium, palladium, osmium, iridium, and the like; an alloy film containing the above metal element as its main component; or the like. The thickness of the separation layer can be 20 nm to 100 nm inclusive.

The silicon oxynitride film 601 is formed in order to improve adhesion between the separation layer and the glass substrate 600. Instead of the silicon oxynitride film 601, a silicon oxide film, a silicon nitride oxide film, a silicon nitride film, a metal oxide film, or the like can be formed by a sputtering method or a PECVD method.

Next, a surface of the tungsten film 602 is oxidized. This oxidation treatment is treatment to generate separation between the base insulating film of the integrated circuit and the tungsten film 602 prior to the other portions. A method for oxidizing the tungsten film 602 is as follows: thermal oxidation treatment; plasma oxidation treatment using oxygen or $N_2O$ plasma; surface treatment using a solution having strong oxidative power, such as ozone water; a method for forming an oxide film in close contact with the top surface of the tungsten film 602 by a sputtering method; or the like. In this embodiment, a method for forming a 200 nm thick silicon oxide film 603 on a top surface of the tungsten film 602 by a sputtering method is employed. Alternatively, instead of oxidizing the surface of the tungsten film 602, separation between the base insulating film and the tungsten film 602 can be generated prior to the other portions also by nitriding the surface of the tungsten film 602 by plasma treatment or heat treatment. Note that also in the case where a film other than a tungsten film is formed as the separation layer, oxidation treatment or nitriding treatment may be performed in a manner similar to that of the tungsten film 602.

After the oxidation treatment of the tungsten film 602 is completed, a base insulating film 604 having a single-layer structure or a stacked structure is formed, and the memory cell array 11 and the driver circuit portion 12 which form the nonvolatile semiconductor memory device 10 may be manufactured over the base insulating film 604. In this embodiment, as for the subsequent steps after formation of the base insulating film 604, a nonvolatile semiconductor memory device is to be manufactured over the glass substrate 600 with the base insulating film 604 interposed therebetween in steps similar to those in the manufacturing method of Embodiment 2. In this case, the island-like semiconductor regions 210, 230, and 250 are to be formed in close contact with the top surface of the base insulating film 604. The base insulating film 604 can be formed in a manner similar to that of the insulating film 201.

Figure 10B:
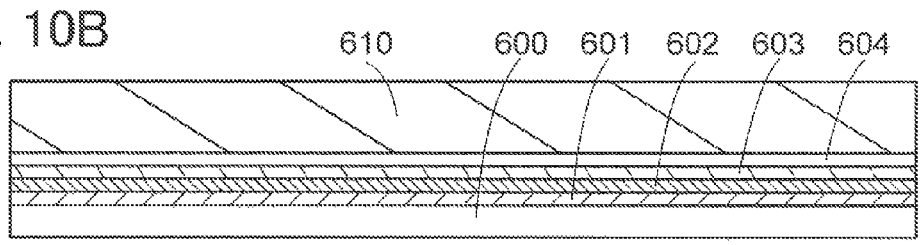

FIG. 10B is a cross-sectional view in which the steps up to FIGS. 1A and 1B are completed. In FIG. 10B, the memory cell array 11 and the driver circuit portion 12 which are formed over the base insulating film 604 is illustrated in a portion denoted by reference numeral "610". Hereinafter, this portion is referred to as an "integrated circuit portion 610".

Figure 10C:
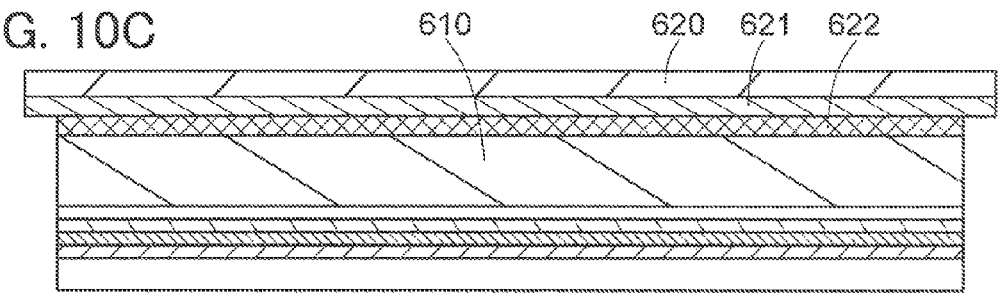

Next, as illustrated in FIG. 10C, a supporting substrate 620 is fixed above the integrated circuit portion 610. The supporting substrate 620 is a substrate removed after the integrated circuit portion 610 is fixed onto another substrate. Thus, the supporting substrate 620 is fixed so as to be separated easily from the integrated circuit portion 610. In this embodiment, the supporting substrate 620 is fixed onto the integrated circuit portion 610 using a two-sided adhesive tape 621. As the supporting substrate 620, a glass substrate, a quartz substrate, a metal substrate, a ceramic substrate, a plastic substrate, or the like can be used. As the two-sided adhesive tape 621, a sheet whose opposite surfaces are covered with a separation adhesive agent can be used. A separation adhesive agent refers to an adhesive agent whose adhesion is weakened by heat, light, or the like. Here, the two-sided adhesive tape 621 using a heat separation adhesive agent is used. Further, in order to facilitate the fixing of the supporting substrate 620, a top surface of the integrated circuit portion 610 is flattened by formation of a soluble resin layer 622 over the integrated circuit portion 610.

Figure 10D:
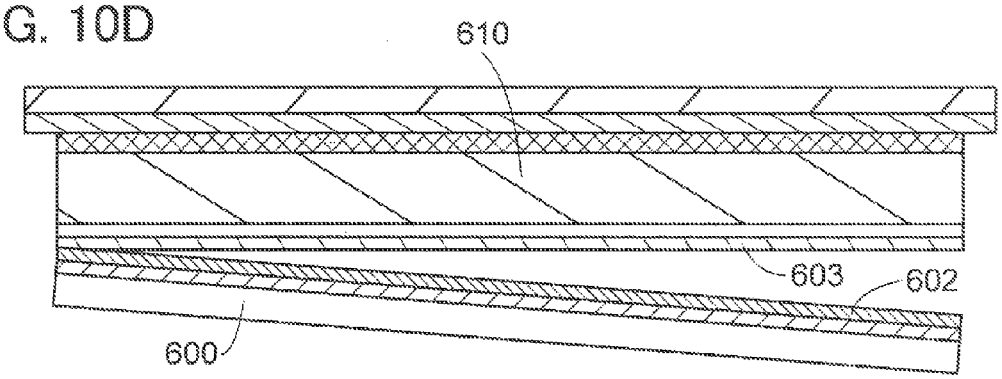

Next, as illustrated in FIG. 10D, separation between the tungsten film 602 and the silicon oxide film 603 is generated so that the integrated circuit portion 610 is separated from the glass substrate 600. In this embodiment, the integrated circuit portion 610 can be separated from the glass substrate 600 by application of physical force such as a load which uses a component having a sharp edge such as a wedge, a person's hand, wind pressure of gas blown from a nozzle, or the like between the tungsten film 602 and the silicon oxide film 603.

Figure 10E:
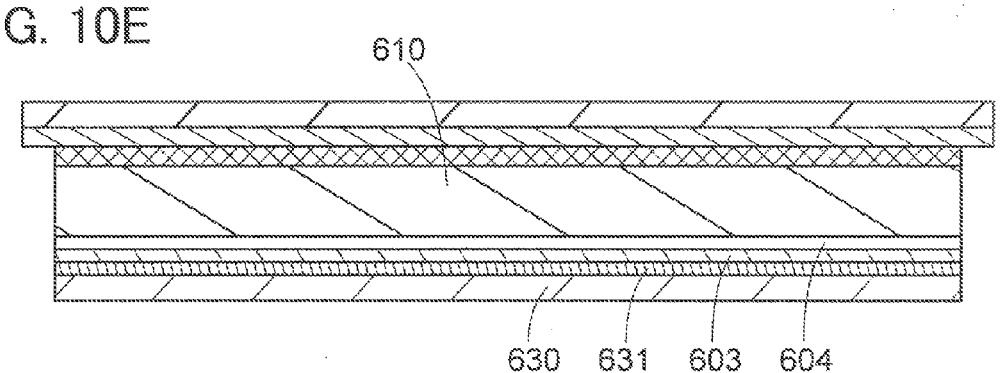

Next, the integrated circuit portion 610 is fixed to a flexible substrate 630. The flexible substrate 630 is a final substrate which supports the integrated circuit portion 610 of the nonvolatile semiconductor memory device. As illustrated in FIG. 10E, the flexible substrate 630 is fixed onto the silicon oxide film 603 which is exposed by separation of the glass substrate 600, using an adhesive agent 631. For the adhesive agent 631, any of a variety of curable adhesive agents, such as a reactive-curable adhesive agent, a thermosetting adhesive agent, a photo-curing adhesive agent such as a UV curable adhesive agent, or an anaerobic-curable adhesive agent can be used. In this embodiment, an epoxy resin is used as the adhesive agent 631. In addition, for the flexible substrate 630, a resin film formed using polyimide, polyethylene naphthalate, polyethylene terephthalate, or the like can be used.

Figure 11A:
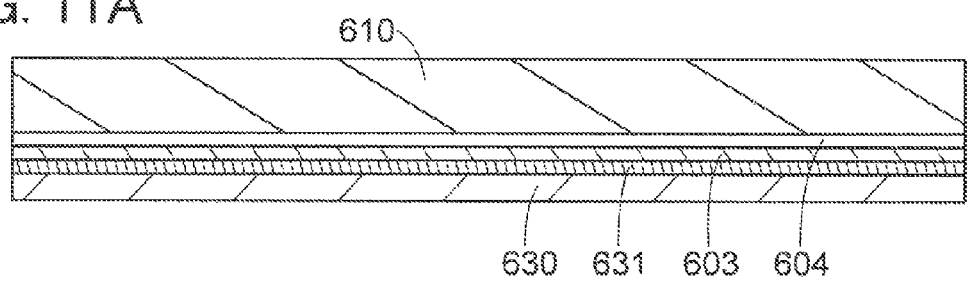
FIGS. 11A and 11B are cross-sectional views illustrating steps subsequent to FIG. 10E.

Next, as illustrated in FIG. 11A, the supporting substrate 620 is removed from the integrated circuit portion 610. By heating, the adhesion of the two-sided adhesive tape 621 is reduced so that the supporting substrate 620 is removed from the integrated circuit portion 610 together with the two-sided adhesive tape 621. Subsequently, the integrated circuit portion 610 is cleaned with pure water, whereby the soluble resin layer 622 is dissolved.

Figure 11B:
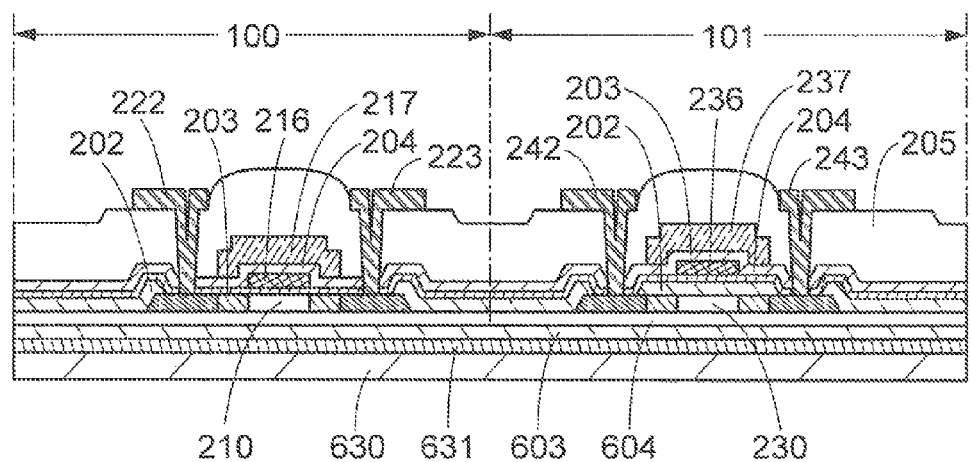

The plurality of integrated circuit portions 610 are formed over the glass substrate 600. Thus, after the soluble resin layer 622 is removed, the flexible substrate 630 is cut, so that the integrated circuit portion 610 is divided into each nonvolatile semiconductor memory device. Accordingly, a nonvolatile semiconductor memory device is completed. FIG. 11B is a cross-sectional view illustrating the main part of the nonvolatile semiconductor memory device which is manufactured by the manufacturing method of this embodiment, where the memory element 100 is illustrated as the main part of the memory cell array 11 and the transistor 101 is illustrated as the main part of the driver circuit portion 12. Note that in FIG. 11B, the cross-sectional structure of the nonvolatile semiconductor memory device is illustrated in the same manner as FIG. 1A.

Since a nonvolatile semiconductor memory device can be manufactured over a flexible substrate such as a film by application of the manufacturing method of this embodiment, the weight and the thickness of the nonvolatile semiconductor memory device can be reduced. In addition, a flexible nonvolatile semiconductor memory device can be manufactured according to this embodiment.

Note that this embodiment can be combined with any of the other embodiments as appropriate.

Embodiment 5

The nonvolatile semiconductor memory device disclosed in this specification can be used as a memory medium in which data can be electrically stored and the stored data can be rewritten. Therefore, the nonvolatile semiconductor memory device can be applied to memory media of electronic devices in various fields. As such electronic devices, for example, there are photographic devices (such as video cameras and digital cameras), display devices (such as liquid crystal display devices and electroluminescence display devices), television receivers, navigation systems (such as in-car systems and aircraft systems), audio reproducing devices (such as digital audio players, car audio systems, and audio components), computers, game machines, portable information terminals (such as mobile computers, cellular phones, smart phones, PDAs, portable game machines, and e-book readers), image reproducing devices (such as digital photo frames, Blu-ray Disc reproducing devices, and DVD reproducing devices), recording devices (such as hard disk recorders, Blu-ray Disc recorders, and DVD recorders), and semiconductor devices having a function of transmitting and receiving data without contact (such as IC chips, RFIDs, ID tags, and IC cards).

Figure 12:
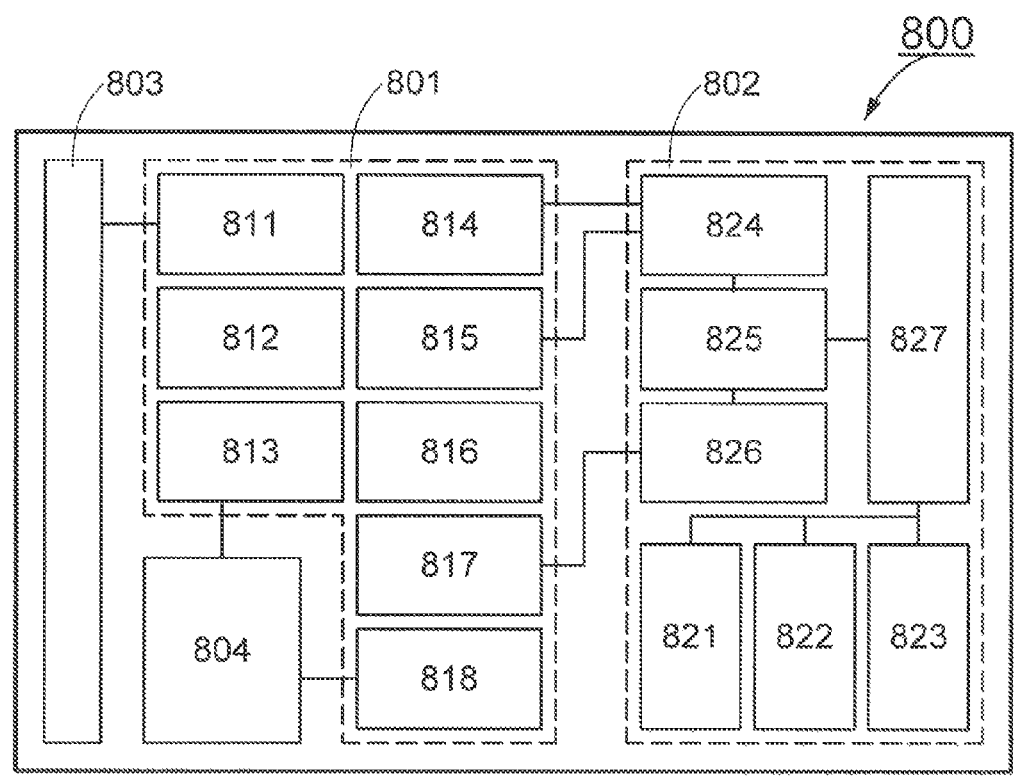
FIG. 12 is a block diagram illustrating an example of a structure of a semiconductor device according to one embodiment of the present invention provided with a nonvolatile semiconductor memory device.

As specific examples of the electronic devices, a semiconductor device having a function of transmitting and receiving data without contact is described. FIG. 12 is a block diagram illustrating an example of a structure of such a semiconductor device. A semiconductor device 800 illustrated in FIG. 12 functions as an arithmetic processing unit which operates by transmitting and receiving signals to and from an external device by wireless communication.

As illustrated in FIG. 12, the semiconductor device 800 includes an analog circuit portion 801, a digital circuit portion 802, an antenna portion 803, and a capacitor portion 804.

The analog circuit portion 801 includes a resonant circuit 811 having a resonant capacitor, a constant voltage circuit 812, a rectifier circuit 813, a demodulation circuit 814, a modulation circuit 815, a reset circuit 816, an oscillator circuit 817, and a power supply control circuit 818.

The digital circuit portion 802 includes a central processing unit 821 (hereinafter referred to as the "CPU 821"), a random access memory 822 (hereinafter referred to as the "RAM 822"), a read only memory 823 (hereinafter referred to as the "ROM 823"), an RF interface 824, a control register 825, a clock controller 826, and a CPU interface 827. The nonvolatile semiconductor memory device disclosed in this specification is applied to the RAM 822, for example.

The antenna portion 803 is provided with an antenna which is configured to transmit and receive signals. The capacitor portion 804 is a circuit which is used to accumulate the power generated in the analog circuit portion 801 and functions as a power supply of the semiconductor device 800. The capacitor portion 804 is preferably formed using a capacitor such as a ceramic capacitor or an electric double layer capacitor. The capacitor portion 804 does not always have to be formed on a substrate included in the semiconductor device 800, and can also be incorporated in the semiconductor device 800 as a separate component.

Next, an operation of the semiconductor device 800 is described. A signal received by the antenna portion 803 is outputted to the resonant circuit 811. In the resonant circuit 811, an induced electromotive force is generated from the received signal. The induced electromotive force is converted to DC power in the rectifier circuit 813 and then stored in the capacitor portion 804. Each circuit of the semiconductor device 800 operates by the power charged in the capacitor portion 804. In the power supply control circuit 818, a power supply voltage (an output voltage of the capacitor portion 804) is monitored.

The demodulation circuit 814 is a circuit which demodulates a received signal, and the modulation circuit 815 is a circuit which modulates data to be transmitted. For example, when the demodulation circuit 814 is formed using a low-pass filter, a received amplitude shift keying (ASK) signal which is a kind of amplitude-modulated signal is binarized based on its amplitude in the demodulation circuit 814. In order to vary the amplitude of transmission data by ASK and transmit the data, the modulation circuit 815 changes the amplitude of a transmitted signal by changing a resonance point of the resonant circuit 811.

The reset circuit 816 generates a signal that resets the digital circuit portion 802 to be initialized. For example, a signal that rises after the increase in the power supply voltage is generated as a reset signal. The oscillator circuit 817 changes the frequency and duty ratio of a clock signal in response to a control signal generated by the constant voltage circuit 812. The clock controller 826 generates a control signal for changing the frequency and the duty ratio of the clock signal in accordance with the power supply voltage or consumption current in the CPU 821.

The signal that is received at the antenna portion 803 is demodulated at the demodulation circuit 814, and then divided into a control command, data, and the like by the RF interface 824. The control command is stored in the control register 825. The control command includes reading of data stored in the ROM 823, writing of data to the RAM 822, an arithmetic instruction to the CPU 821, and the like.

The CPU 821 accesses the ROM 823, the RAM 822, and the control register 825 via the CPU interface 827. The CPU interface 827 generates an access signal for any of the RAM 822, the ROM 823, and the control register 825 based on an address requested by the CPU 821.

As an arithmetic method of the CPU 821, a method may be employed in which the ROM 823 stores an operating system (OS) and a program is read and executed at the same time as starting of the CPU 821. Alternatively, a method may be employed in which a dedicated circuit is provided as an arithmetic circuit and an arithmetic processing is performed using hardware. In a method in which both hardware and software are used, part of the arithmetic processing may be conducted by a dedicated arithmetic circuit and the other part of the arithmetic processing may be conducted by the CPU 821 using a program.

Next, the use of the semiconductor device 800 of this embodiment is described. Since the semiconductor device 800 illustrated in FIG. 12 can conduct wireless communication without contact, the semiconductor device 800 is embedded in paper or interposed between two plastic substrates, whereby an IC card can be formed.

When the semiconductor device 800 is embedded in paper, and bills, securities, bearer bonds, and certificates are manufactured using this paper, an authentication function can be imparted to these pieces of paper, whereby forgery thereof can be prevented.

In addition, the semiconductor device 800 can be used for a wireless IC chip. A wireless IC chip is used while being fixed to various objects. As a method for fixing the semiconductor device 800 onto the objects, there are methods for embedding the semiconductor device 800 in the objects or attaching the semiconductor device 800 to the surface of the objects.

Further, as the objects which are used to fix the semiconductor device 800 thereto, for example, the following objects can be given: packaging containers (such as wrapping paper and bottles), recording media (such as Blu-ray Discs, DVDs, and USB memories), personal belongings (such as bags, glasses, and clothing), foods, plants, animals (such as domestic animals and pets), commodities, and shipping tags and labels on products and on packs. When the semiconductor device 800 is mounted on these objects, inspection, distribution management, historical management of the objects, and the like are easily systematized.

For example, when the semiconductor device 800 is mounted on a shipping tag or a price tag of a product and information stored in the semiconductor device 800 is read with a reader/writer which is provided beside a conveyor belt, information about a manufacturing process, a distribution process, a delivery destination, and the like are obtained and thus product inspection and stock management can be performed with high efficiency.

Note that this embodiment can be combined with any of the other embodiments as appropriate.

Example 1

In this example, nonvolatile memory elements having the respective structures which were the same as those of the memory elements 100, 110, and 910 were manufactured to compare each element in resistance to rewriting. Here, a nonvolatile memory element having the same structure as the memory element 100 is referred to as a "memory element A", and a nonvolatile memory element having the same structure as the memory element 110 is referred to as a "memory element B". In addition, a nonvolatile memory element having the same structure as the memory element 910 is referred to as a "memory element x".

First, a method for manufacturing the memory element A and the memory element B is described. As the substrate 200, a non-alkali glass substrate was used. As the insulating film 201, a stacked film of a 50 nm thick silicon nitride oxide film and a 100 nm thick silicon oxynitride film was formed over the substrate 200 by a PECVD method.

The island-like semiconductor region 210 was formed using a polycrystalline silicon film. The polycrystalline silicon film was formed as follows. First, a 66 nm thick amorphous silicon film was formed by a PECVD method using hydrogen and monosilane as a source gas. Next, heat treatment was performed at 500° C. for one hour and at 550° C. for four hours, whereby hydrogen was released from the amorphous silicon film. Then, the amorphous silicon film was irradiated with the second-harmonic laser beam (wavelength: 532 nm) of a $YVO_4$ laser, thereby being crystallized to form a polycrystalline silicon film. The $YVO_4$ laser was a semiconductor laser (LD) pumped continuous wave laser. Then, the polycrystalline silicon film was processed into a desired shape by etching treatment, so that the island-like semiconductor region 210 was formed over the insulating film 201. As the insulating film 202, a silicon oxynitride film was formed by a PECVD apparatus. As for the thickness of the silicon oxynitride film, the thickness was 27 nm in the memory element A and 15 nm in the memory element B (see FIG. 5A).

Next, in the memory element A and the memory element B, the opening 218 and the opening 418 were formed, respectively, in the insulating film 202 (see FIG. 5B).

The insulating film 203 was formed as follows. First, an oxide film was formed by the solid-phase oxidation of the island-like semiconductor region 210 by high-density plasma oxidation treatment. The processing time of the plasma oxidation treatment was adjusted so that the oxide has a thickness of approximately 3 nm. Then, a 7 nm thick silicon oxynitride film was formed by a PECVD apparatus using a monosilane ($SiH_4$) gas and a nitrogen suboxide ($N_2O$) gas as a source gas. The mass flow ratio of the source gas was $SiH_4:N_2O=1:800$. In addition, plasma excitation was performed under the following conditions: the power of a high-frequency power supply was 150 W; the frequency of the high-frequency power supply, 60 MHz; the film formation temperature (substrate temperature), 400° C.; the pressure in the treatment chamber, 40 Pa; and the electrode interval, 28 mm. After the silicon oxynitride film was formed, high-density plasma oxidation treatment was performed again. Next, as the conductive film 350, a 30 nm thick tungsten film was formed over the insulating film 203 by a sputtering apparatus (see FIG. 5C).

The resist 351 was formed over the tungsten film and the tungsten film was processed into a predetermined shape by etching treatment using the resist 351 as a mask, so that the conductive film 216 serving as a floating gate electrode was formed (see FIG. 5D).

Next, phosphorus was added to the island-like semiconductor region 210 by a plasma doping apparatus with existence of the resist 351, so that the impurity regions 352 and 353 were formed. In the memory element A, phosphorus was added to the island-like semiconductor region 210 under the conditions in which a 5% $PH_3$ gas diluted with hydrogen was used as a source gas, the dose was set at $1.0\times10^{13}$ cm$^{-2}$, and the accelerating voltage was set at 40 kV. In the memory element B, the accelerating voltage was set at 20 kV, and the other conditions were similar to the conditions of the memory element A (see FIG. 6A).

Then, a silicon oxynitride film was formed as the insulating film 204 by a PECVD apparatus so as to cover the conductive film 216. As for the thickness of the silicon oxynitride film, the thickness was 25 nm in the memory element A and 33 nm in the memory element B. As the conductive film 360, a stacked film of a 30 nm thick tantalum nitride film and a 150 nm thick tungsten film was formed by a sputtering apparatus (see FIG. 6B).

The stacked film of the tantalum nitride film and the tungsten film was etched using a resist mask, so that the conductive film 217 was formed (see FIG. 6C).

Next, phosphorus was added to the island-like semiconductor region 210 by a plasma doping apparatus using the conductive film 217 as a mask, so that the n-type high concentration regions 212 and 213 and the n-type low concentration impurity regions 214 and 215 were formed. This step of adding an impurity element is performed in the memory element A under the conditions in which a 5% $PH_3$ gas diluted with hydrogen was used as a source gas, the dose was set at $2.0\times10^{15}$ $cm^{-2}$, and the accelerating voltage was set at 30 kV. On the other hand, in the memory element B, the accelerating voltage was set at 35 kV, and the other conditions were similar to the conditions of the memory element A (see FIG. 7B).

Then, a stacked film of a 50 nm thick silicon oxynitride film, a 100 nm thick silicon nitride oxide film, and a 600 nm thick silicon oxynitride film was formed as the insulating film 205 so as to cover the conductive film 217. These films are formed by a PECVD apparatus. After the 50 nm thick silicon oxynitride film was formed, heat treatment was performed at 550° C. in a nitrogen atmosphere, thereby activating phosphorus that had been added to the island-like semiconductor region 210. After that, the 600 nm thick silicon oxynitride film was formed. Subsequently, the contact holes 224 to 226 were formed in the insulating films 203 to 205 (see FIG. 7C).

Next, a conductive film having a four-layer structure of a 60 nm thick titanium film, a 40 nm thick titanium nitride film, a 300 nm thick pure aluminum film, and a 100 nm thick titanium film was formed over the insulating film 205 by a sputtering apparatus. This stacked film was processed into a desired shape by etching treatment, so that the conductive films 221 to 223 were formed. Through the above-described steps, the memory element A and the memory element B were manufactured (see FIGS. 1A and 1B).

Note that the memory element x, which is a comparative example, was manufactured under conditions similar to those of the memory element B except that the insulating film 202 was not formed.

The difference of the memory element x from the memory element A and the memory element B is the structure of the first gate insulating film which exists between the island-like semiconductor region and the floating gate electrode. The thick film region in which the insulating films 202 and 203 are stacked only exists in a channel width direction (a direction horizontal to a gate) of a channel formation region of the memory element A, whereas the thick film region exists in both the channel width direction and a channel length direction (a direction perpendicular to the gate) of a channel formation region of the memory element B. In the memory element x, the thick film region does not exist in the first gate insulating film (see FIGS. 9A to 9C).

Figure 13:
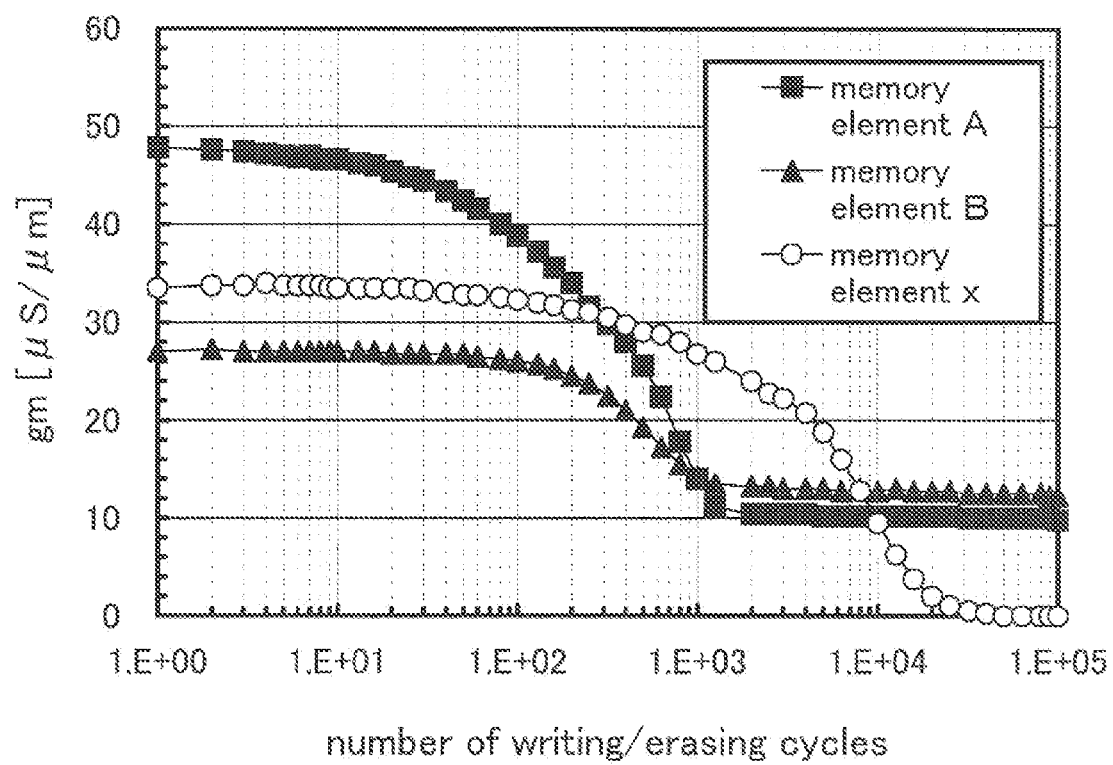
FIG. 13 is a graph showing the change of a memory element A and the memory element B according to one embodiment of the present invention from a comparative example, a memory element x, in mutual conductance gm with respect to the number of writing/erasing cycles.

With such a structure provided for the first gate insulating film, it is possible to obtain such advantageous effects that the value of mutual conductance gm does not take the predetermined value or less in the memory element A and the memory element B even when a rewriting operation is performed as shown in Formula (4). In order to demonstrate this advantageous effect, the change of mutual conductance gm in a rewriting operation of each of the memory element A, the memory element B, and the memory element x was measured. The result thereof is shown in FIG. 13. FIG. 13 is a graph showing the change of mutual conductance gm with respect to the number of writing/erasing cycles. Note that the memory element A, the memory element B, and the memory element x had channel widths of 5 μm, 4 μm, and 4 μm, respectively; and the channel lengths were all 1 μm.

F-N tunneling current was used for both writing and erasing of each of the memory element A, the memory element B, and the memory element x. The same potential was applied to source and drain regions, and a writing voltage and an erasing voltage were applied between the source region and the control gate electrode and between the drain region and the control gate electrode so that a difference between threshold voltages in a writing state and an erasing state (a threshold value window width) became approximately 5 V at an initial state. The memory element A, the memory element B, and the memory element x had writing voltages of 15 V, 16 V, and 13.5 V, respectively; and erasing voltages of −13.5 V, −15 V, and −16 V, respectively. The writing voltages and erasing voltages of the memory element A, the memory element B, and the memory element x were applied for 500 microseconds.

The graph in FIG. 13 shows that after a writing/erasing cycle is performed for hundred thousands of times, the memory element x of a comparative example deteriorates so much that the value of mutual conductance (hereinafter referred to as the "gm value") becomes 0. When the gm value decreases, for example, a memory transistor does not function as a nonvolatile memory element, a writing state cannot be distinguished from an erasing state or vice versa, and thus rewriting to the memory transistor is incapable; accordingly, reliability is decreased.

Further, FIG. 13 shows that the gm value is decreased also in both the memory element A and the memory element B when a writing/erasing cycle is repeated; however, when the number of cycles is 1000 or more, the decreases in the gm value converge and thus the gm value is maintained to the predetermined value. The minimum value of the gm value required as a nonvolatile memory element depends on the performance of a peripheral circuit that reads information on the nonvolatile memory element. In the memory element A and the memory element B of this example, the gm value which is maintained even when the number of writing/erasing cycles is hundred thousands or more can be set almost arbitrarily by practitioners depending on a region where the insulating films 202 and 203 are stacked, the length in a channel width direction of the channel formation region that exists in the region, the film thickness of the insulating films 202 and 203, and the like.

The thick film region of the first gate insulating film between the island-like semiconductor region and the floating gate electrode was provided only in a channel width direction of the channel formation region of the memory element A but was provided in both a channel length direction and the channel width direction of the channel formation region of the memory element B. However, in both the memory element A and the memory element B, the mutual conductance was maintained to the predetermined value or more even when a rewriting operation was repeated. Therefore, it was demonstrated that it was possible to maintain the value of mutual conductance of a nonvolatile memory element to the predetermined value or more even when a rewriting operation was repeated as described in Embodiment 1, by selectively providing, in the first gate insulating film, a thick film region which is thick enough not to be involved in injection and extraction of electric charge into and from the floating gate electrode with a writing operation and an erasing operation.

The present application is based on Japanese Patent Application serial No. 2009-037635 filed with Japan Patent Office on Feb. 20, 2009, the entire contents of which are hereby incorporated by reference.

What is claimed is:

1. A nonvolatile semiconductor memory device, comprising:
   a memory cell array comprising a nonvolatile memory element, comprising:
      a first island-like semiconductor region formed over a substrate, and having a first channel formation region, and a first source region and a first drain region including a first impurity element imparting conductivity;
      a first gate insulating film comprising a second insulating film over the first island-like semiconductor region;
      a floating gate electrode over the first gate insulating film;
      a second gate insulating film comprising a third insulating film over the floating gate electrode; and
      a control gate electrode over the second gate insulating film; and
   a driver circuit portion electrically connected to the memory cell array, comprising a transistor, comprising:
      a second island-like semiconductor region formed over the substrate, and having a second channel formation region, and a second source region and a second drain region including a second impurity element imparting conductivity;
      a third gate insulating film comprising a first insulating film over the second island-like semiconductor region and the second insulating film over the first insulating film; and
      a gate electrode comprising a first conductive film over the third gate insulating film and a second conductive film formed over the first conductive film, and electrically connected to the first conductive film,
      wherein the third insulating film is provided between the first conductive film and the second conductive film.

2. The nonvolatile semiconductor memory device according to claim 1, wherein the floating gate electrode is shorter than the control gate electrode in a channel length direction.

3. The nonvolatile semiconductor memory device according to claim 1, further comprising:
   a low concentration impurity region formed in the first island-like semiconductor region, which overlaps with the floating gate electrode but not with the control gate electrode, and where a concentration of the first impurity element is lower than the concentrations of the first impurity element in the first source region and the first drain region.

4. The nonvolatile semiconductor memory device according to claim 1, wherein the first conductive film is shorter than the second conductive film in a channel length direction.

5. The nonvolatile semiconductor memory device according to claim 1, further comprising:
   a low concentration impurity region formed in the second island-like semiconductor region, which overlaps with the first conductive film but not with the second conductive film, and where a concentration of the second impurity element is lower than the concentrations of the second impurity element in the second source region and the second drain region.

6. The nonvolatile semiconductor memory device according to claim 1, wherein the first conductive film is longer than the second conductive film in a channel length direction.

7. The nonvolatile semiconductor memory device according to claim 1, wherein a conductive film which forms the floating gate electrode is the same as a conductive film which forms the first conductive film.

8. The nonvolatile semiconductor memory device according to claim 1, wherein a conductive film which forms the control gate electrode is the same as a conductive film which forms the second conductive film.

9. The nonvolatile semiconductor memory device according to claim 1, wherein the first island-like semiconductor region and the second island-like semiconductor region include an amorphous semiconductor film.

10. An electronic device comprising the nonvolatile semiconductor memory device according to claim 1.

11. A nonvolatile semiconductor memory device, comprising:
    a memory cell array comprising a nonvolatile memory element, comprising:
       a first island-like semiconductor region formed over a substrate, and having a first channel formation region, and a first source region and a first drain region including a first impurity element imparting conductivity;
       a first gate insulating film comprising a first insulating film formed over the first island-like semiconductor region, and having an opening to expose the first channel formation region, and a second insulating film over the first insulating film;
       a floating gate electrode over the first gate insulating film, and overlapping the opening;
       a second gate insulating film comprising a third insulating film over the floating gate electrode; and
       a control gate electrode over the second gate insulating film; and
    a driver circuit portion electrically connected to the memory cell array, comprising a transistor comprising:
       a second island-like semiconductor region formed over the substrate, and having a second channel formation region, and a second source region and a second drain region including a second impurity element imparting conductivity;
       a third gate insulating film comprising the first insulating film over the second island-like semiconductor region and the second insulating film over the first insulating film; and
       a gate electrode comprising a first conductive film over the third gate insulating film and a second conductive film formed over the first conductive film, and electrically connected to the first conductive film,
       wherein the third insulating film is provided between the first conductive film and the second conductive film.

12. The nonvolatile semiconductor memory device according to claim 11, wherein the first insulating film includes a portion where an end portion of the first island-like semiconductor region is covered.

13. The nonvolatile semiconductor memory device according to claim 11, wherein the floating gate electrode is shorter than the control gate electrode in a channel length direction.

14. The nonvolatile semiconductor memory device according to claim 11, further comprising:
    a low concentration impurity region formed in the first island-like semiconductor region, which overlaps with the floating gate electrode but not with the control gate electrode, and where a concentration of the first impurity element is lower than the concentrations of the first impurity element in the first source region and the first drain region.

15. The nonvolatile semiconductor memory device according to claim 11, wherein the first conductive film is shorter than the second conductive film in a channel length direction.

16. The nonvolatile semiconductor memory device according to claim 11, further comprising:
a low concentration impurity region formed in the second island-like semiconductor region, which overlaps with the first conductive film but not with the second conductive film, and where a concentration of the second impurity element is lower than the concentrations of the second impurity element in the second source region and the second drain region.

17. The nonvolatile semiconductor memory device according to claim 11, wherein the first conductive film is longer than the second conductive film in a channel length direction.

18. The nonvolatile semiconductor memory device according to claim 11, wherein a conductive film which forms the floating gate electrode is the same as a conductive film which forms the first conductive film.

19. The nonvolatile semiconductor memory device according to claim 11, wherein a conductive film which forms the control gate electrode is the same as a conductive film which forms the second conductive film.

20. The nonvolatile semiconductor memory device according to claim 11, wherein the first island-like semiconductor region and the second island-like semiconductor region include an amorphous semiconductor film.

21. An electronic device comprising the nonvolatile semiconductor memory device according to claim 11.

* * * * *